(12) United States Patent
Liu et al.

(10) Patent No.: US 11,398,673 B2
(45) Date of Patent: Jul. 26, 2022

(54) PACKAGE STRUCTURE WITH ANTENNA IN PACKAGE AND COMMUNICATIONS DEVICE

(71) Applicant: HUAWEI TECHNOLOGIES CO., LTD., Guangdong (CN)

(72) Inventors: Liangsheng Liu, Shenzhen (CN); Ming Chang, Shanghai (CN); Jiajie Tang, Shanghai (CN); Laicun Lin, Shanghai (CN); Heng Qu, Shanghai (CN); Hailin Dong, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/077,745

(22) Filed: Oct. 22, 2020

(65) Prior Publication Data

US 2021/0044011 A1    Feb. 11, 2021

Related U.S. Application Data

(63) Continuation of application No. PCT/CN2019/078569, filed on Mar. 18, 2019.

(30) Foreign Application Priority Data

Apr. 25, 2018   (CN) .......................... 201810379363.9

(51) Int. Cl.
*H01Q 1/52*    (2006.01)
*H01Q 1/22*    (2006.01)
(Continued)

(52) U.S. Cl.
CPC .......... *H01Q 1/523* (2013.01); *H01Q 1/2283* (2013.01); *H01Q 9/0407* (2013.01); *H01Q 21/065* (2013.01)

(58) Field of Classification Search
CPC .......... H01Q 1/2283; H01Q 1/38; H01Q 1/52; H01Q 1/521; H01Q 1/523; H01Q 9/0407; H01Q 21/06; H01Q 21/065
See application file for complete search history.

(56) References Cited

U.S. PATENT DOCUMENTS 6,154,176 A  *  11/2000 Fathy .................. H01Q 9/0414
                                                      343/846
10,797,405 B1 * 10/2020 Baek ..................... H05K 1/181
(Continued)

FOREIGN PATENT DOCUMENTS

CN    202759438 U    2/2013
CN    103247581 A    8/2013
(Continued)

OTHER PUBLICATIONS

PCT International Search Report and Written Opinion in International Application No. PCT/CN2019/078,569, dated Jun. 19, 2019, 13 pages (With English Translation).
(Continued)

*Primary Examiner* — Jason Crawford
(74) *Attorney, Agent, or Firm* — Fish & Richardson P.C.

(57) ABSTRACT

This application provides an example package structure with an antenna in package. The example package structure includes a substrate and a chip fastened under the substrate. The antenna in package includes a first radiator. The substrate includes a core layer and a first conductor layer, where the first radiator and a first conductive block are disposed on the first conductor layer. The package structure further includes a feed network, where the chip is coupled to the feed network, and the feed network provides feeding for the antenna in package. This application further provides a communications device.

17 Claims, 10 Drawing Sheets

(51) Int. Cl.
*H01Q 9/04* (2006.01)
*H01Q 21/06* (2006.01)

(56) References Cited

U.S. PATENT DOCUMENTS

| | | | |
|---|---|---|---|
| 10,985,451 B2* | 4/2021 | Kim | H01L 21/568 |
| 11,081,453 B2* | 8/2021 | Liu | H01L 23/3135 |
| 11,189,905 B2* | 11/2021 | Gu | H01L 21/4853 |
| 2003/0020173 A1* | 1/2003 | Huff | H01Q 21/0087 |
| | | | 257/774 |
| 2009/0168367 A1* | 7/2009 | Fujii | H01L 23/3677 |
| | | | 361/720 |
| 2009/0256752 A1* | 10/2009 | Akkermans | H01Q 1/2283 |
| | | | 343/700 MS |
| 2012/0212384 A1* | 8/2012 | Kam | H01Q 1/2283 |
| | | | 343/834 |
| 2013/0093629 A1 | 4/2013 | Chiu et al. | |
| 2013/0207274 A1* | 8/2013 | Liu | H01L 23/66 |
| | | | 257/774 |
| 2014/0145883 A1* | 5/2014 | Baks | H01L 23/66 |
| | | | 343/700 MS |
| 2015/0340765 A1* | 11/2015 | Dang | H01Q 1/2208 |
| | | | 343/893 |
| 2016/0049723 A1* | 2/2016 | Baks | H01Q 13/10 |
| | | | 343/848 |
| 2016/0056544 A1* | 2/2016 | Garcia | H01Q 9/0407 |
| | | | 343/725 |
| 2016/0104934 A1 | 4/2016 | Jang et al. | |
| 2016/0276729 A1* | 9/2016 | Dang | H01P 3/121 |
| 2017/0155185 A1* | 6/2017 | Hong | H01Q 1/24 |
| 2017/0236776 A1* | 8/2017 | Huynh | H01Q 1/2283 |
| | | | 438/26 |
| 2018/0076526 A1 | 3/2018 | Garcia et al. | |
| 2018/0159203 A1* | 6/2018 | Baks | H01Q 21/065 |
| 2020/0106188 A1* | 4/2020 | Ou | H01Q 5/357 |
| 2021/0044011 A1* | 2/2021 | Liu | H01Q 1/22 |

FOREIGN PATENT DOCUMENTS

| | | |
|---|---|---|
| CN | 103311213 A | 9/2013 |
| CN | 104037137 A | 9/2014 |
| CN | 105514572 A | 4/2016 |
| CN | 106847771 A | 6/2017 |
| CN | 107871935 A | 4/2018 |

OTHER PUBLICATIONS

Office Action issued in Chinese Application No. 201810379363.9 dated Jun. 30, 2020, 23 pages (With English Translation).
Extended European Search Report in European Application No. 19793478.9, dated May 21, 2021, 10 pages.

* cited by examiner

PACKAGE STRUCTURE WITH ANTENNA IN PACKAGE AND COMMUNICATIONS DEVICE

CROSS-REFERENCE TO RELATED APPLICATIONS

This application is a continuation of International Application No. PCT/CN2019/078569, filed on Mar. 18, 2019, which claims priority to Chinese Patent Application No. 201810379363.9, filed on Apr. 25, 2018. The disclosures of the aforementioned applications are hereby incorporated by reference in their entireties.

TECHNICAL FIELD

This application relates to the field of electronic devices, and in particular, to a package structure with an antenna in package and a communications device.

BACKGROUND

Currently, with the advent of a high-rate communication era such as a 5th generation mobile communications technology (5G) and VR (virtual reality), millimeter wave communication gradually becomes a mainstream, and demands for designs and applications of millimeter-wave antennas are also increasing. Because a length of a transmission path on a millimeter wave band greatly affects a signal amplitude loss, a conventional structure mode of a chip (Integrated circuit, IC, also referred to as an integrated circuit)+a printed circuit board (Printed Circuit Board, PCB)+an antenna (Antenna) gradually cannot meet a high-performance requirement, and a structure of a chip+a package structure with an antenna becomes a mainstream, and such a structure with an antenna is a package structure with an antenna in package (Antenna in Package, AiP).

In the package structure with an antenna in package, some conductor layers in the antenna package are generally used only for laying antennas in package, and a residual copper ratio is low. As a result, bubbles easily occur during package, a product yield rate is less than 10%, and mass production cannot be achieved.

SUMMARY

This application provides a package structure with an antenna in package and a communications device, where the package structure with an antenna in package has a high product yield rate.

According to a first aspect, this application provides a package structure with an antenna in package. The antenna in package can implement millimeter wave communication. The package structure with an antenna in package is applicable to a communications device. The package structure with an antenna in package may be fastened on a circuit board of the communications device. The communications device may be any device that has a wireless communication requirement, for example, a mobile terminal.

The package structure includes a substrate and a chip fastened under the substrate. The antenna in package includes a first radiator. The substrate includes a core layer and a first conductor layer. The first radiator and a first conductive block are disposed on the first conductor layer. The package structure further includes a feed network. The chip is coupled to the feed network, and the feed network provides feeding for the antenna in package. The first conductor layer is made of a conductive material. In this application, a copper material is used as an example for description. A layout ratio of the conductive material for the first conductor layer is a residual copper ratio. The first conductive block is made of a conductive material. In this application, it is not limited that the first conductive block needs to be electrically disposed.

The first radiator and the first conductive block are spaced away from each other, so that the first radiator and the first conductive block are insulated from each other. The first conductive block is configured to increase the layout ratio of the conductive material for the first conductor layer. In other words, the first conductive block is a dummy shape that is not used for radiation. Laying the first conductive block on the first conductor layer can increase the residual copper ratio of the first conductor layer, so that the residual copper ratio of the first conductor layer is comparatively high. This avoids occurrence of bubbles during manufacturing of the substrate, and increases a product yield rate of the substrate, so that mass production of the substrate is achieved, and the package structure has a comparatively high product yield rate.

In an embodiment, one or more isolation units are disposed on the first conductor layer. The one or more isolation units each include the first conductive block. There are at least two first radiators. The one or more isolation units are configured to isolate the at least two first radiators from each other.

In this embodiment, the at least two first radiators are isolated from each other through the one or more isolation units, so that coupling between different first radiators is reduced, that is, near-field crosstalk between different antennas in package is reduced, and a signal sent or received by the antenna in package in the package structure has better quality.

The isolation unit may isolate the at least two first radiators from each other in a surrounding manner or a blocking manner. For example, a plurality of isolation units are disposed on the first conductor layer. Each isolation unit surrounds one first radiator. Each isolation unit includes at least two first conductive blocks distributed around the corresponding first radiator. In this case, each isolation unit isolates the first radiator in the surrounding manner. This prevents a signal of the first radiator from radiating out from the isolation unit and prevents a signal of another first radiator from radiating in the isolation unit. There are two first radiators, a slot is formed between the two first radiators, and an isolation unit is disposed in the slot. In this case, the isolation unit is arranged on a path of coupling between the two first radiators, to block signal radiation between the two first radiators.

In an embodiment, the substrate further includes a second conductor layer. The antenna in package further includes a second radiator. The second radiator and a second conductive block are disposed on the second conductor layer. A projection of the second radiator on the core layer at least partially overlaps a projection of the first radiator on the core layer. The second conductor layer is made of a conductive material. In this application, a copper material is used as an example for description. A layout ratio of the conductive material for the second conductor layer is a residual copper ratio. The second conductive block is made of a conductive material. In this application, it is not limited that the second conductive block needs to be electrically disposed.

The second radiator and the second conductive block are spaced away from each other, so that the second radiator and the second conductive block are insulated from each other.

The second conductive block is configured to increase the layout ratio of the conductive material for the second conductor layer. In other words, the second conductive block is a dummy shape that is not used for radiation. Laying the second conductive block on the second conductor layer can increase the residual copper ratio of the second conductor layer, so that the residual copper ratio of the second conductor layer is comparatively high. This avoids occurrence of bubbles during manufacturing of the substrate, and increases a product yield rate of the substrate, so that mass production of the substrate is achieved, and the package structure has a comparatively high product yield rate.

The antenna in package sends and receives a signal through both the second radiator and the first radiator, so that a radiation effect and a bandwidth of the signal can be enhanced. In addition, during signal transmission inside the package structure with a comparatively high product yield rate, characteristic impedance matching of a signal is good, and signal transmission quality is high.

In an embodiment, at least two second radiators are disposed on the second conductor layer, and the second conductive block is configured to isolate the at least two second radiators from each other. In this embodiment, the at least two second radiators are isolated from each other through the second conductive block, so that coupling between different second radiators is reduced, that is, near-field crosstalk between different antennas in package is reduced, and a signal sent or received by the antenna in package in the package structure has better quality.

In an embodiment, there are a plurality of first radiators on the first conductor layer. The plurality of first radiators are arranged in an array. There are a plurality of second radiators on the second conductor layer. The plurality of second radiators are arranged in an array. The plurality of second radiators one-to-one correspond to the plurality of first radiators. A projection of a second radiator on the core layer at least partially overlaps a projection of a corresponding first radiator on the core layer. For example, a plurality of first radiators form a 4×4 array, a plurality of second radiators form a 4×4 array, and the array formed by the plurality of second radiators corresponds to the array formed by the plurality of first radiators. In this case, an array antenna includes a plurality of antennas in package arranged in an array, to implement beam sweeping. In this way, the array antenna can be better applied to a high-speed millimeter-wave communications system.

The plurality of antennas in package are coupled to one chip, and the chip sends and receives a signal through the plurality of antennas in package of the array, so that the signal has comparatively high strength.

In an embodiment, there are a plurality of first conductive blocks on the first conductor layer. The plurality of first radiators are spaced away from each other, the plurality of first conductive blocks are spaced away from each other, and the first radiator and the first conductive block adjacent to the first radiator are spaced away from each other. There are a plurality of second conductive blocks on the second conductor layer. The plurality of second radiators are spaced away from each other, the plurality of second conductive blocks are spaced away from each other, and the second radiator and the second conductive block adjacent to the second radiator are spaced away from each other. In this case, the first conductive block may isolate the plurality of first radiators from each other. The second conductive block may isolate the plurality of second radiators from each other.

In an embodiment, there are a plurality of second conductive blocks. The plurality of second conductive blocks are arranged in an array. A first conductive strip is connected between adjacent second conductive blocks. In other words, the adjacent second conductive blocks are connected through the first conductive strip. All the first conductive strips and all the second conductive blocks jointly form a first grid electric wall. There are a plurality of grid spaces on the first grid electric wall. The plurality of grid spaces may be arranged in an array. There are a plurality of second radiators. Different second radiators are distributed in different grid spaces. In other words, four second conductive blocks disposed around one second radiator and four first conductive strips connected between the second conductive blocks jointly form a grid space in a surrounding manner.

In this embodiment, disposing of the plurality of first conductive strips further increases the residual copper ratio of the second conductor layer, thereby increasing a product yield rate of the substrate. The plurality of second radiators are located in the grid spaces of the first grid electric wall in a one-to-one corresponding manner, and each of the second radiators is surrounded by the first grid electric wall. Therefore, coupling between different second radiators can be reduced through the first grid electric wall, that is, near-field crosstalk between different antennas in package can be reduced, thereby improving isolation between different antennas in package. In addition, all the grid spaces of the first grid electric wall having an encircling electric wall structure form a radiation window. This helps increase an antenna gain of the antenna in package.

The array in which the plurality of second conductive blocks are arranged has an array row direction and an array column direction, and the array row direction and the array column direction are perpendicular to each other. When the first conductive strip is in a straight line, an extension direction of the first conductive strip is the array row direction or the array column direction. Alternatively, the first conductive strip may be curved.

In an embodiment, a slot is disposed on the first conductive strip. Adjacent grid spaces communicate with each other through the slot. In other words, two grid spaces located on two sides of the first conductive strip communicate with each other through the slot. The slot enables all the grid spaces on the first grid electric wall to communicate with each other. This can ensure resin fluidity and gas fluidity in the substrate in a pressing manufacturing process of the substrate, and further reduce a probability of occurrence of bubbles during lamination. Therefore, the product yield rate of the substrate is comparatively high.

In an embodiment, the first conductor layer and the second conductor layer are spaced away from each other. In this case, a spacing between the first conductor layer and the second conductor layer is comparatively large, and this can meet a bandwidth requirement of the antenna in package.

In an embodiment, the substrate further includes at least one third conductor layer. The at least one third conductor layer is sandwiched between the first conductor layer and the second conductor layer. Each third conductor layer includes a third conductive block. A projection of the third conductive block on the core layer does not overlap a projection of the second radiator on the core layer. Laying the third conductive block on the third conductor layer implements that the third conductor layer has a comparatively high residual copper ratio. This avoids occurrence of bubbles during manufacturing of the substrate, and increases product yield rates of the substrate and the package structure.

In an embodiment, there are a plurality of third conductive blocks. The plurality of third conductive blocks are arranged in an array. A second conductive strip is connected between adjacent third conductive blocks. In other words, the adjacent third conductive blocks are connected through the second conductive strip. An extension direction of the second conductive strip is an array row direction or an array column direction. All the second conductive strips and the third conductive blocks jointly form a second grid electric wall. In other words, each third conductor layer includes a second grid electric wall.

A projection of the second grid electric wall on the core layer at least partially overlaps a projection of the first grid electric wall on the core layer. Specifically, projections of a plurality of third conductive blocks on the core layer at least partially overlap projections of a plurality of second conductive blocks on the core layer. Projections of a plurality of second conductive strips on the core layer at least partially overlap projections of a plurality of first conductive strips on the core layer. There are a plurality of grid spaces on the second grid electric wall. The plurality of grid spaces are arranged in an array. Projections of different second radiators on the third conductor layer are distributed in different grid spaces.

In this embodiment, each third conductor layer includes the second grid electric wall, and the projection of the second grid electric wall on the core layer at least partially overlaps the projection of the first grid electric wall on the core layer. No copper material is laid in an area, on each third conductor layer, that directly faces the first radiator and the second radiator. Therefore, disposing of the second grid electric wall does not affect coupling between the first radiator and the second radiator, and a residual copper ratio of each third conductor layer can be further increased instead. This improves a product yield rate of the substrate, reduces coupling between different antennas in package, and improves array performance of the antenna in package in the package structure.

In an embodiment, the substrate further includes a plurality of first conductive columns. The plurality of first conductive columns are connected between two adjacent second grid electric walls and are connected between the first grid electric wall and a second grid electric wall adjacent to the first grid electric wall. The plurality of first conductive columns are formed on a dielectric layer between the two adjacent second grid electric walls and formed on a dielectric layer between the first grid electric wall and the second grid electric wall adjacent to the first grid electric wall. A via may be disposed on a corresponding dielectric layer, and a conductive material (for example, copper) is filled in the via to form the first conductive column.

In this embodiment, the plurality of first conductive columns are used to connect the two adjacent second grid electric walls, and to connect the second grid electric wall and the first grid electric wall adjacent to the second grid electric wall, so that the second grid electric wall, the first conductive column, and the first grid electric wall jointly form a stereoscopic electric wall. The stereoscopic electric wall penetrates through the at least one third conductor layer, the second conductor layer, a dielectric layer sandwiched between adjacent third conductor layers, and a dielectric layer sandwiched between the third conductor layer and a second conductor layer adjacent to the third conductor layer, so that a stereoscopic isolation effect can be achieved. This effectively reduces near-field coupling between different antennas in package on the substrate, reduces crosstalk between the different antennas in package, and improves array performance of the antennas in package. The stereoscopic electric wall can further form a stereoscopic radiation window. This helps increase an antenna gain of the antenna in package.

Each second conductive block is connected to at least two rows of first conductive columns. Two rows of first conductive columns of the at least two rows of first conductive columns are intersected with each other in arrangement directions. For example, each second conductive block is connected to four rows of first conductive columns. Two rows of first conductive columns are arranged along an array row direction, the other two rows of first conductive columns are arranged along an array column direction, and the two rows of first conductive columns arranged along the array row direction are intersected with the two rows of first conductive columns arranged along the array column direction.

In this embodiment, two rows of first conductive columns of the at least two rows of first conductive columns are intersected with each other in arrangement directions, and each row of first conductive columns can form one isolation wall. Therefore, two intersected isolation walls are formed between the first grid electric wall and the second grid electric wall adjacent to the first grid electric wall, to implement isolation in different directions. In this way, the stereoscopic electric wall can implement multi-directional isolation and has a better isolation effect, and the antenna in package has better array performance.

Two rows of first conductive columns of at least two rows of first conductive columns that are connected to one second conductive block are perpendicular to each other in arrangement directions (for example, one row of first conductive columns are arranged along an array row direction, and the other row of first conductive columns are arranged along an array column direction), to form two perpendicular isolation walls. Because a plurality of second conductive blocks are arranged in an array, isolation walls connected to the plurality of second conductive blocks can jointly form an approximately grid-shaped isolation environment, so that isolation can be better implemented in cooperation with the first grid electric wall and the second grid electric wall, and the stereoscopic electric wall has a better isolation effect.

Each first conductive strip is connected to at least two rows of first conductive columns. Each row of first conductive columns are arranged along an extension direction of the corresponding first conductive strip. The at least two rows of first conductive columns form at least two stacked isolation walls, so that an isolation wall of the stereoscopic electric wall is comparatively thick, and a signal cannot penetrate the isolation wall of the stereoscopic electric wall. Therefore, the stereoscopic electric wall has a better isolation effect, and the antenna in package has better array performance.

In an embodiment, the first conductive blocks on the first conductor layer are arranged in an array. In this case, the first conductive blocks arranged in an array one-to-one correspond to the third conductive blocks arranged in an array. The substrate further includes a plurality of second conductive columns. The plurality of second conductive columns are connected between the first conductive block and the second grid electric wall adjacent to the first conductive block. The second grid electric wall is disposed close to the first conductive block. The plurality of second conductive columns are connected to the plurality of third conductive blocks on the second grid electric wall. The plurality of second conductive columns are formed on a dielectric layer between the first conductive block and the second grid electric wall adjacent to the first conductive block. A via may be disposed on the dielectric layer, and a conductive material (for example, copper) is filled in the via to form the second conductive column.

In this embodiment, the plurality of first conductive blocks, the plurality of second conductive columns, the second grid electric wall, the first conductive column, and the first grid electric wall jointly form a stereoscopic electric wall. The stereoscopic electric wall extends from the conductor layer on which the first radiator is located to the conductor layer on which the second radiator is located, so that near-field coupling between different antennas in package in the substrate can be effectively reduced, that is, crosstalk between different antennas in package can be reduced, and array performance of the antennas in package in the package structure can be improved. A radiation window formed by the stereoscopic electric wall helps increase an antenna gain.

Each first conductive block is connected to at least two rows of second conductive columns. Two rows of second conductive columns of the at least two rows of second conductive columns are intersected with each other in arrangement directions. For example, the first conductive blocks are arranged in an array, and the array has an array row direction and an array column direction. Each first conductive block is connected to four rows of second conductive columns. Two rows of second conductive columns are arranged along the array row direction, and the other two rows of second conductive columns are arranged along the array column direction. The two rows of second conductive columns arranged along the array row direction are intersected with the two rows of second conductive columns arranged along the array column direction.

In this embodiment, because of arrangement directions of at least two rows of the second conductive columns, each row of second conductive columns can form one isolation wall. Therefore, two intersected isolation walls are formed between the first conductive block and the second grid electric wall adjacent to the first conductive block, to implement isolation in different directions. In this way, the stereoscopic electric wall can implement multi-directional isolation and has a better isolation effect, and the antenna in package has better array performance.

Two rows of second conductive columns of at least two rows of second conductive columns that are connected to one first conductive block are perpendicular to each other in arrangement directions (for example, one row of second conductive columns are arranged along an array row direction, and the other row of second conductive columns are arranged along an array column direction), to form two perpendicular isolation walls. Because a plurality of first conductive blocks are arranged in an array, isolation walls connected to the plurality of first conductive blocks can jointly form an approximately grid-shaped isolation environment, so that isolation can be better implemented in cooperation with the second grid electric wall, and the stereoscopic electric wall has a better isolation effect.

In an embodiment, a connection strip is connected between two adjacent first conductive blocks. In other words, the two adjacent first conductive blocks are connected through the connection strip. All the connection strips and the first conductive blocks are arranged to jointly form a grid shape. In this case, each grid on the first conductor layer forms one isolation unit.

In this embodiment, a plurality of connection strips and a plurality of first conductive blocks on the first conductor layer jointly form a grid-shaped electric wall. This can increase a residual copper ratio of the first conductor layer, and reduce coupling between different first radiators, so that the package structure has comparatively good performance.

Each connection strip is connected to at least two rows of second conductive columns. Each row of second conductive columns are arranged along an extension direction of the corresponding connection strip. All the connection strips are connected to form a part of the stereoscopic electric wall. The at least two rows of second conductive columns form at least two stacked isolation walls, so that an isolation wall of the stereoscopic electric wall is comparatively thick, and a signal cannot penetrate the isolation wall of the stereoscopic electric wall. Therefore, the stereoscopic electric wall has a better isolation effect, and the antenna in package has better array performance.

In an embodiment, the substrate includes a plurality of conductor layers. The core layer and the plurality of conductor layers are disposed in a stacked manner. The plurality of conductor layers are made of a conductive material. In this application, a copper material is used as an example for description. The plurality of conductor layers are distributed on two sides of the core layer. The plurality of conductor layers include a first conductor layer and a second conductor layer. The first conductor layer is located on a side that is of the core layer and that is farther away from the chip. The second conductor layer is sandwiched between the first conductor layer and the core layer. The plurality of conductor layers may further include a third conductor layer.

The plurality of conductor layers include an upper part and a lower part. The upper part of the conductor layers is distributed on the side that is of the core layer and that is farther away from the chip, and the lower part of the conductor layers is distributed on the side that is of the core layer and that is closer to the chip. The upper part of the conductor layers and the lower part of the conductor layers may be symmetrically disposed relative to the core layer, to reduce a probability that the substrate is warped during manufacturing. There are five layers in the upper part of the conductor layer, and there are five layers in the lower part of the conductor layer. The upper part of the conductor layers and the lower part of the conductor layers are symmetrical relative to the core layer.

The substrate further includes a protective layer. An example in which the upper part of the conductor layers includes five layers and the lower part of the conductor layers includes five layers is used for description in this application. Protective layers are disposed on both a surface that is of the first layer of the conductor layers and that is farther away from the chip and a surface that is of the tenth layer of the conductor layers and that is closer to the chip. The protective layer is an insulation layer. A protective layer is also disposed on the first conductor layer on a side that is of the substrate and that is closer to the chip.

In an embodiment, the plurality of conductor layers further include at least one fourth conductor layer. The at least one fourth conductor layer is sandwiched between the core layer and the chip. Each fourth conductor layer includes at least one of a conducting wire or a conductive block. The conducting wire may be one or more of a power cable, a ground cable, or a signal cable. The conductive block may be one or more of a ground block and a power supply block. For example, a ground block is laid on each fourth conductor layer.

In this embodiment, a quantity of fourth conductor layers is the same as total quantities of the first conductor layer, the second conductor layer, and the third conductor layer. In this application, the residual copper ratio of the first conductor layer is comparatively high, and a residual copper ratio of a fourth conductor layer symmetrical to the first conductor layer is close to the residual copper ratio of the first conductor layer; the residual copper ratio of the second conductor layer is comparatively high, and a residual copper ratio of a fourth conductor layer symmetrical to the second conductor layer is close to the residual copper ratio of the second conductor layer; and the residual copper ratio of the third conductor layer is comparatively high, and a residual copper ratio of a fourth conductor layer symmetrical to the third conductor layer is close to the residual copper ratio of the third conductor layer. Therefore, a difference between residual copper ratios of the conductor layers of the substrate that are stacked relative to the core layer is comparatively small, so that co-planarity of the substrate is comparatively good. This can effectively reduce a risk of warping of the substrate, and a product yield rate of the substrate is comparatively high.

A ground conductive column is disposed between two ground blocks located on adjacent layers. A ground conductive column is disposed on the core layer. The stereoscopic electric wall is grounded through the ground conductive column, the ground block, and a solder ball. The ground conductive column is configured to provide overall signal reflow and heat dissipation for the package structure.

In an embodiment, the first conductive block is made of a metallic material. The metallic material is conductive, so that the first conductive block can implement a function of an electric wall. The second conductive block may also be made of a metallic material. The third conductive block may also be made of a metallic material. In another embodiment, the first conductive block, the second conductive block, and the third conductive block may be alternatively made of another conductive material.

In an embodiment, the substrate further includes a dielectric layer sandwiched between the first radiator and the second radiator, and the dielectric layer is made of a low-dielectric-constant material. A structure in which the first radiator and the second radiator in the antenna in package are stacked, and the dielectric layer that is made of a low-dielectric-constant material and that is sandwiched between the first radiator and the second radiator help the antenna in package implement performance of a high bandwidth and a high gain.

The substrate further includes a dielectric layer distributed at another location. The dielectric layer is filled between adjacent conductor layers to implement insulation. No dielectric layer is disposed between the core layer and a conductor layer closest to the chip. When the upper part of the conductor layers and the lower part of the conductor layers are symmetrically disposed relative to the core layer, a plurality of dielectric layers are symmetrically disposed on two sides of the core layer. The plurality of dielectric layers are made of an insulation material.

In an embodiment, the feed network uses probe feeding, slot feeding, or dual-probe feeding. When the feed network uses probe feeding or dual-probe feeding, the feed network is electrically connected to the antenna in package directly. When the feed network uses slot feeding, the feed network is electrically connected to the antenna in package in a coupling manner.

In an embodiment, the feed network includes a first feeder and a second feeder that are electrically connected to the chip. One second radiator includes a first feeding point and a second feeding point, the first feeding point is configured to connect to the first feeder, the second feeding point is configured to connect to the second feeder, and the first feeding point and the second feeding point are spaced away from each other. In this embodiment, the feed network uses dual-probe feeding.

The first feeder includes a trace routed on the conductor layer, a via disposed on the dielectric layer, and a via disposed on the core layer. The second feeder includes a trace routed on the conductor layer, a via disposed on the dielectric layer, and a via disposed on the core layer. The first feeder and the second feeder are spaced away from each other. An isolation wall is disposed between the first feeder and the second feeder, and the isolation wall is configured to reduce coupling between the first feeder and the second feeder, so that a signal sent or received by the antenna in package has high quality. The isolation wall includes the trace routed on the conductor layer and the via disposed on the dielectric layer.

In this embodiment, because one second radiator includes a first feeding point and a second feeding point, that is, because two polarization feeding ports are disposed on a single antenna in package, and either of the two polarization feeding ports may be used as a horizontal polarization feeding port or a vertical polarization feeding port, a combination of the two polarization feeding ports is used for dual-polarization feeding. Circular polarization or elliptical polarization can be implemented for the antenna in package by performing amplitude and phase adjustment on both the two feeding ports.

In another embodiment, one feeding point may be alternatively disposed on one second radiator, and the substrate includes a feeder connected to the feeding point, so that the antenna in package in the package structure implements single polarization feeding.

The chip is a radio frequency component, and the chip sends and receives a radio frequency signal through the antenna in package. A silicon chip is used as a base material for the chip, and an integrated circuit is disposed on the silicon chip. The chip is configured to provide active excitation, including an amplitude and phase adjustment function, and the chip provides feeding for the antenna in package through the feed network. The chip includes a plurality of pins, and the plurality of pins may be solder pads disposed on a surface of the silicon chip. The plurality of pins include a ground pin, a power supply pin, an input/output pin, a signal control pin, and the like. The chip is electrically connected to the substrate through the pins. A plurality of solder balls are disposed on a side that is of the substrate and that faces the chip. The plurality of solder balls are configured to fasten the package structure to the circuit board, to structurally and electrically connect the package structure and the circuit board.

According to a second aspect, this application further provides a communications device, and the communications device includes a circuit board and a package structure with an antenna in package. The package structure is disposed on the circuit board. The communications device may be a product such as a mobile phone, a tablet computer, or a router. For example, the communications device may be a mobile phone. The circuit board and the package structure are disposed inside a housing of the communications device. The antenna in package is configured to send and receive a radio frequency signal. The radio frequency signal includes but is not limited to a wireless local area network signal, a Bluetooth signal, a global navigation satellite system signal, a 2G signal, a 3G signal, a 4G signal, or a 5G signal.

BRIEF DESCRIPTION OF DRAWINGS

To describe the technical solutions in the embodiments of this application or in the background more clearly, the following briefly describes the accompanying drawings for describing the embodiments of this application or the background.

DESCRIPTION OF EMBODIMENTS

The following describes embodiments of this application with reference to the accompanying drawings in the embodiments of this application.

Figure 1:
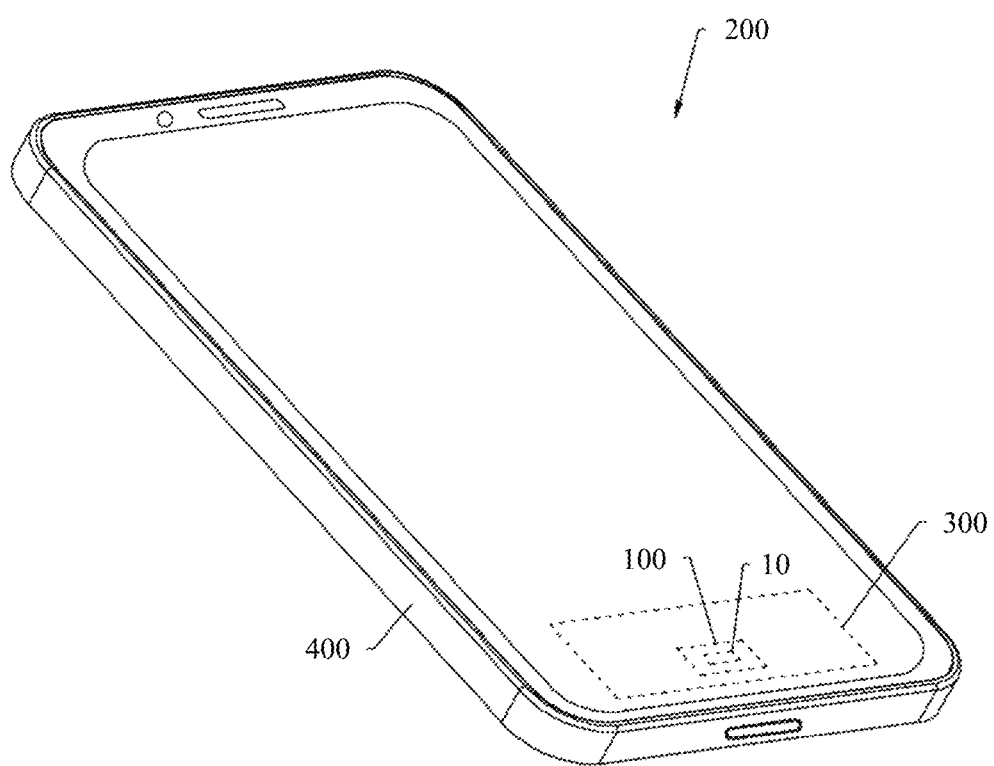
FIG. 1 is a schematic structural diagram of a communications device according to an embodiment of this application.

Referring to FIG. 1, an embodiment of this application provides a package structure 100 with an antenna 10 in package. The package structure 100 can implement millimeter wave communication. The package structure 100 is applicable to a communications device 200. The package structure 100 may be fastened on a circuit board 300 of the communications device 200. The communications device 200 may be any device that has a wireless communication requirement, for example, a mobile terminal shown in FIG. 1.

Figure 2:
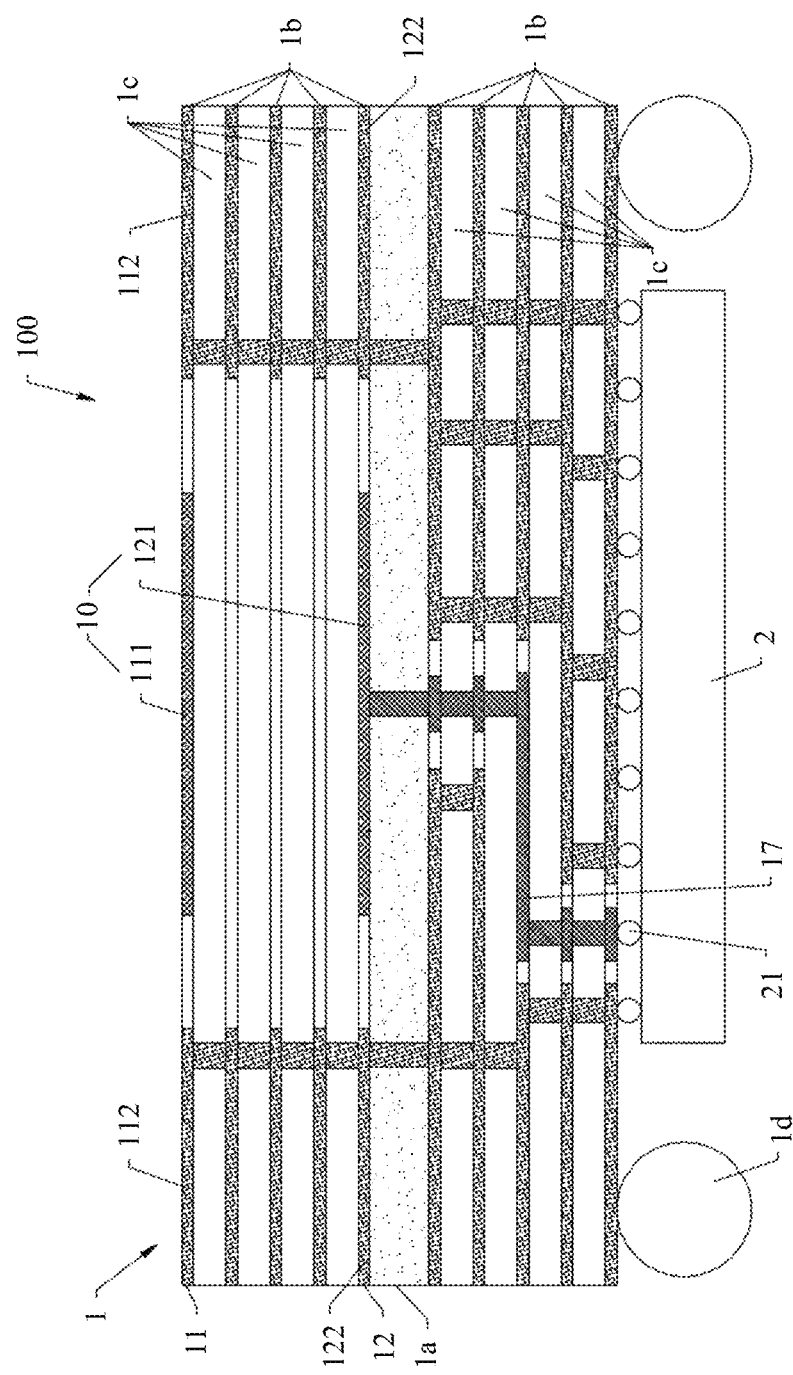
FIG. 2 is a schematic structural diagram of a package structure of an electronic device shown in FIG. 1 in an embodiment.

Referring to FIG. 2, the package structure 100 includes a substrate 1 and a chip 2 fastened under the substrate 1. The antenna 10 in package includes a first radiator 111. The substrate 1 includes a core layer 1a and a first conductor layer 11. The first radiator 111 and a first conductive block 112 are disposed on the first conductor layer 11. The package structure 100 further includes a feed network 17. The chip 2 is coupled to the feed network 17, and the feed network 17 provides feeding for the antenna 10 in package. The first conductor layer 11 is made of a conductive material. In this application, a copper material is used as an example for description. A layout ratio of the conductive material for the first conductor layer 11 is a residual copper ratio. The first conductive block 112 is made of a conductive material. In this application, it is not limited that the first conductive block 112 needs to be electrically disposed.

The first radiator 111 and the first conductive block 112 are spaced away from each other, so that the first radiator 111 and the first conductive block 112 are insulated from each other. The first conductive block 112 is configured to increase the layout ratio of the conductive material for the first conductor layer 11. In other words, the first conductive block 112 is a dummy shape (dummy shape) that is not used for radiation. Laying the first conductive block 112 on the first conductor layer 11 can increase the residual copper ratio of the first conductor layer 11, so that the residual copper ratio of the first conductor layer 11 is comparatively high. This can avoid occurrence of bubbles during manufacturing of the substrate 1, and increase a product yield rate of the substrate 1, so that mass production of the substrate 1 is achieved, and the package structure 100 has a comparatively high product yield rate.

Figure 3:
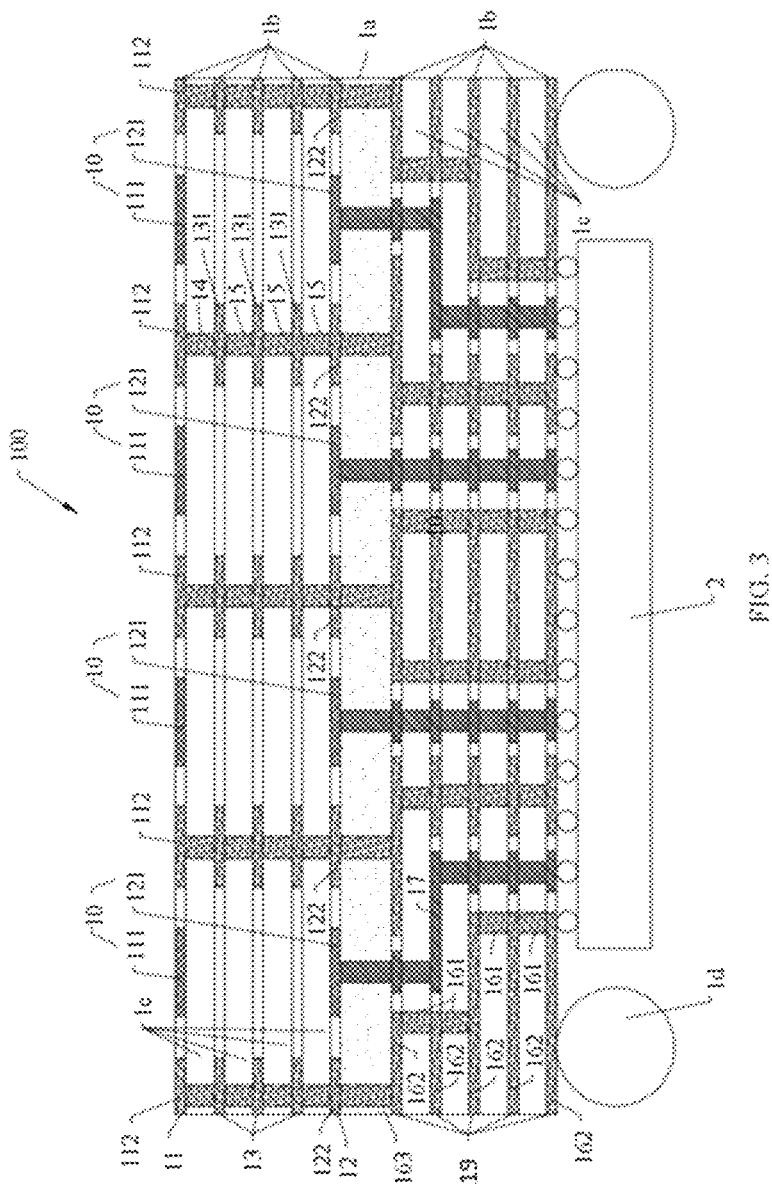
FIG. 3 is a schematic structural diagram of a package structure of the electronic device shown in FIG. 1 in another embodiment.
Figure 4:
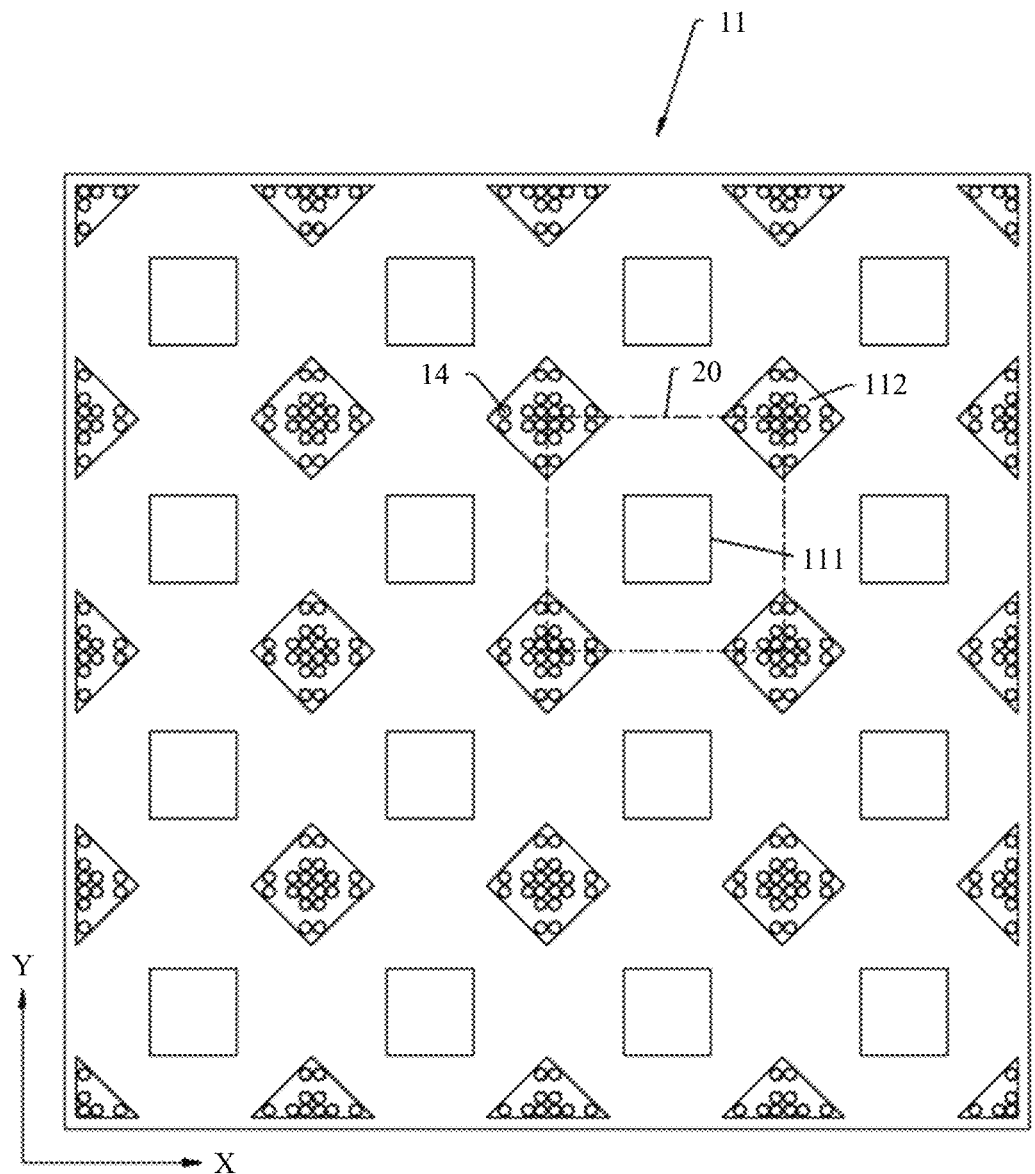
FIG. 4 is a top view of a first conductor layer and a second conductive column in the package structure shown in FIG. 3.
Figure 5:
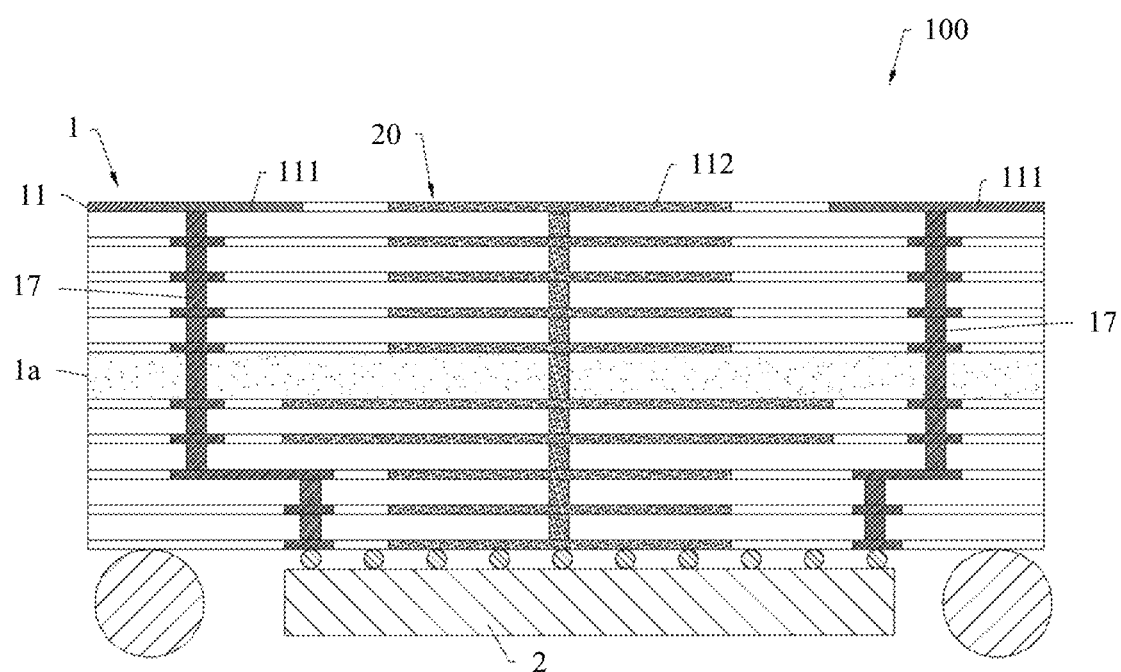
FIG. 5 is a schematic structural diagram of a package structure of the electronic device shown in FIG. 1 in still another embodiment.

In an embodiment, referring to FIG. 3 to FIG. 5, one or more isolation units 20 are disposed on the first conductor layer 11. The one or more isolation units 20 each include the first conductive block 112. There are at least two first radiators 111. The one or more isolation units 20 are configured to isolate the at least two first radiators 111 from each other.

In this embodiment, the at least two first radiators 111 are isolated from each other through the one or more isolation units 20, so that coupling between different first radiators 111 is reduced, that is, near-field crosstalk between different antennas 10 in package is reduced, and a signal sent or received by the package structure 100 has better quality.

The isolation unit 20 may isolate the at least two first radiators 111 from each other in a surrounding manner or a blocking manner.

For example, referring to FIG. 3 and FIG. 4, a plurality of isolation units 20 are disposed on the first conductor layer 11. Each isolation unit 20 surrounds one first radiator 111. Each isolation unit 20 includes at least two first conductive blocks 112 distributed around the corresponding first radiator 111. For example, each isolation unit 20 includes four first conductive blocks 112 distributed around the first radiator 111. In other words, a plurality of first radiators 111 are arranged in different isolation units 20. The four first conductive blocks 112 around each first radiator 111 jointly form the isolation unit 20 (FIG. 4 shows one of the isolation units 20) of the first radiator 111. Adjacent isolation units 20 share two first conductive blocks 112 between the adjacent isolation units 20. In this case, each isolation unit 20 isolates the first radiator 111 in the surrounding manner. This prevents a signal of the first radiator 111 from radiating out from the isolation unit 20 and prevents a signal of another first radiator 111 from radiating in the isolation unit 20.

It may be understood that, in another embodiment, the first conductive blocks 112 in the isolation unit 20 may be arranged in a manner different from that in the structure shown in FIG. 4. The first conductive blocks 112 in the isolation unit 20 may be disposed to surround the first radiator 111. For example, each isolation unit 20 includes two first conductive blocks 112, and the first radiator 111 is sandwiched between the two first conductive blocks 112. Alternatively, each isolation unit 20 includes three first conductive blocks 112, and connection lines between adjacent first conductive blocks 112 form a triangle. Alternatively, there are more than four first conductive blocks 112 in each isolation unit 20, and connection lines of adjacent first conductive blocks 112 form various polygons, such as a pentagon and a hexagon. Alternatively, there are three or more first conductive blocks 112 in each isolation unit 20, and all the first conductive blocks 112 are arranged into a circle or an ellipse surrounding the first radiator 111. The first conductive block 112 may be a polygonal block (for example, a square block or a triangular block), a circular block, an elliptical block, a sector block, or the like. A specific shape and a specific arrangement manner of the first conductive block 112 are not strictly limited in this application.

Alternatively, referring to FIG. 5, there are two first radiators 111. A slot is formed between the two first radiators 111, and an isolation unit 20 is disposed in the slot. In this case, the isolation unit 20 is arranged on a path of coupling between the two first radiators 111, to block signal radiation between the two first radiators 111.

Referring to FIG. 5, the antenna structure 100 shown in FIG. 5 shows an embodiment in which a single antenna 10 in package includes a single radiator (that is, the first radiator 111). Referring to FIG. 2 and FIG. 3, the antenna structure 100 shown in FIG. 2 and FIG. 3 shows an embodiment in which a single antenna 10 in package includes two radiators (111 and 121). In this application, an example in which the single antenna 10 in package includes two radiators is used for description. It may be understood that, in another embodiment, the single antenna 10 in package in the antenna structure 100 may include three or more radiators.

Figure 6:
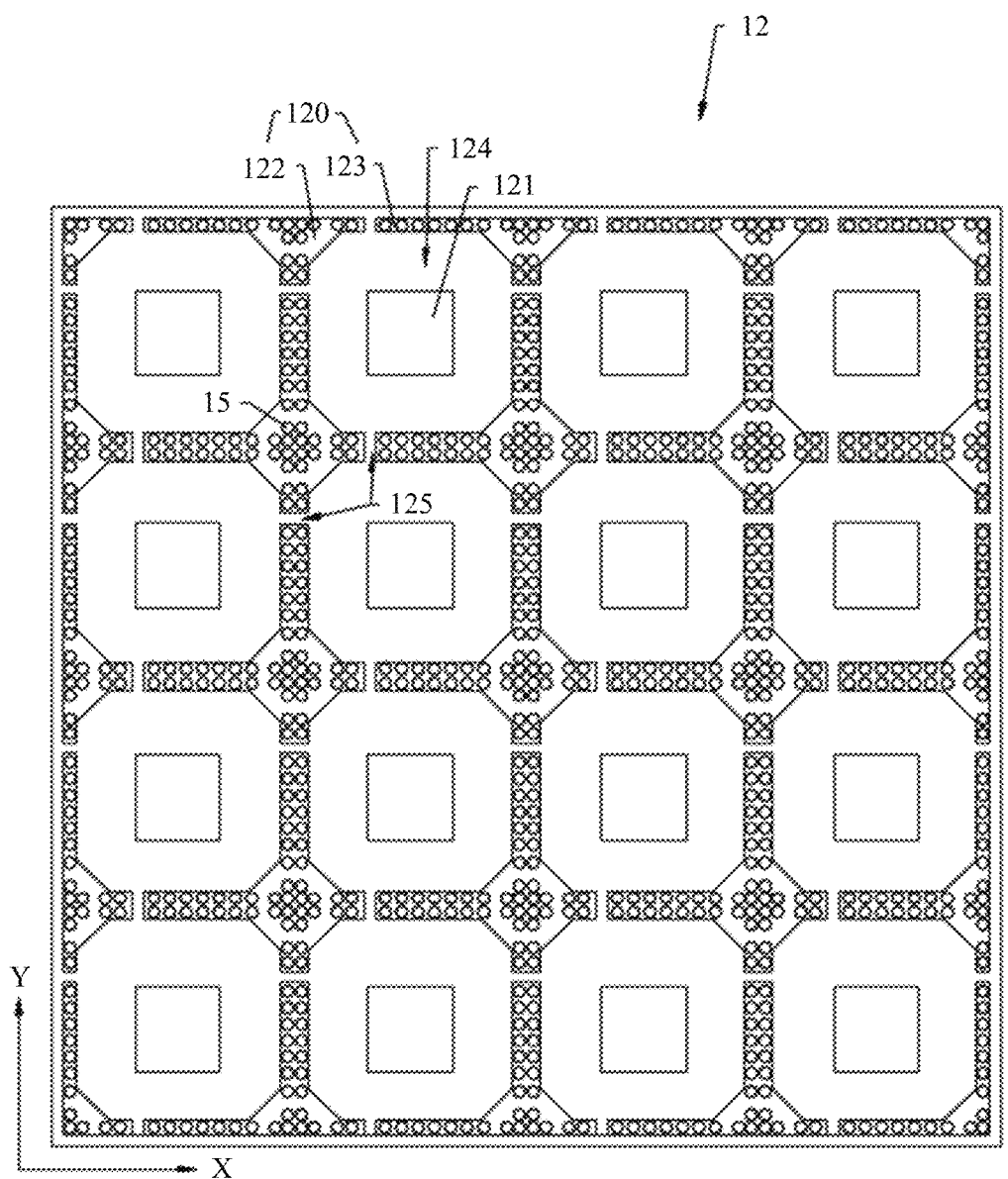
FIG. 6 is a top view of a second conductor layer and a first conductive column in the package structure shown in FIG. 3.

In an embodiment, referring to FIG. 3 and FIG. 6, the substrate 1 further includes a second conductor layer 12. The antenna 10 in package further includes a second radiator 121. The second radiator 121 and a second conductive block 122 are disposed on the second conductor layer 12. A projection of the second radiator 121 on the core layer 1a at least partially overlaps a projection of the first radiator 111 on the core layer 1a. The second conductor layer 12 is made of a conductive material. In this application, a copper material is used as an example for description. A layout ratio of the conductive material for the second conductor layer 12 is a residual copper ratio. The second conductive block 122 is made of a conductive material. In this application, it is not limited that the second conductive block 122 needs to be electrically disposed.

The second radiator 121 and the second conductive block 122 are spaced away from each other, so that the second radiator 121 and the second conductive block 122 are insulated from each other. The second conductive block 122 is configured to increase the layout ratio of the conductive material for the second conductor layer 12. In other words, the second conductive block 122 is a dummy shape that is not used for radiation. Laying the second conductive block 122 on the second conductor layer 12 can increase the residual copper ratio of the second conductor layer 12, so that the residual copper ratio of the second conductor layer 12 is comparatively high. This avoids occurrence of bubbles during manufacturing of the substrate 1, and increases a product yield rate of the substrate 1, so that mass production of the substrate 1 is achieved, and the package structure 100 has a comparatively high product yield rate.

The antenna 10 in package sends and receives a signal through both the second radiator 121 and the first radiator 111, so that a radiation effect and a bandwidth of the signal can be enhanced. Experiments prove that the antenna 10 in package in the package structure 100 can implement characteristics of a high gain and a large bandwidth in a frequency band from 57 GHz (gigahertz) to 66 GHz. In addition, during signal transmission inside the package structure 100 with a comparatively high product yield rate, characteristic impedance matching of a signal is good, and signal transmission quality is high.

In this application, "at least partially overlap" may be "partially overlap", or may be "completely overlap". For example, when the projection of the second radiator 121 on the core layer 1a at least partially overlaps the projection of the first radiator 111 on the core layer 1a, the second radiator 121 and the first radiator 111 may be arranged in manners including but not limited to the following embodiments. In an embodiment, as shown in FIG. 3, the first radiator 111 and the second radiator 121 are patches having a same shape and a same size, the first radiator 111 and the second radiator 121 are disposed opposite to each other, and the projection of the second radiator 121 on the core layer 1a completely overlaps the projection of the first radiator 11 on the core layer 1a. In another embodiment, the first radiator 111 and the second radiator 121 are patches having a same shape but different sizes, the first radiator 111 and the second radiator 121 are disposed opposite to each other, the projection of the second radiator 121 on the core layer 1a partially overlaps the projection of the first radiator 11 on the core layer 1a, and geometric centers of the projections overlap with each other. In another embodiment, the first radiator 111 and the second radiator 121 are patches having different shapes, the first radiator 111 and the second radiator 121 are disposed opposite to each other, the projection of the second radiator 121 on the core layer 1a partially overlaps the projection of the first radiator 11 on the core layer 1a, and geometric centers of the projections overlap with each other.

The first radiator 111 and the second radiator 121 each may be in a plurality of shapes. In this application, an example in which the first radiator 111 is a square and the second radiator 121 is a square is used for description. A side length of the first radiator 111 is set based on a half wavelength of an antenna working center frequency of the antenna 10 in package. For example, the side length of the first radiator 111 is slightly less than the half wavelength of the antenna working center frequency of the antenna 10 in package.

In an embodiment, referring to FIG. 3 and FIG. 6, at least two second radiators 121 are disposed on the second conductor layer 12. The second conductive block 122 is configured to isolate the at least two second radiators 121 from each other. In this embodiment, the at least two second radiators 121 are isolated from each other through the second conductive block 122, so that coupling between different second radiators 122 is reduced, that is, near-field crosstalk between different antennas 10 in package is reduced, and a signal sent or received by the antenna 10 in package in the package structure 100 has better quality.

In an embodiment, referring to FIG. 3, FIG. 4, and FIG. 6, there are a plurality of first radiators 111 on the first conductor layer 11. The plurality of first radiators 111 are arranged in an array. There are a plurality of second radiators 121 on the second conductor layer 12. The plurality of second radiators 121 are arranged in an array. The plurality of second radiators 121 one-to-one correspond to the plurality of first radiators 111. A projection of a second radiator 121 on the core layer 1a at least partially overlaps a projection of a corresponding first radiator 111 on the core layer 1a. For example, as shown in FIG. 4, the plurality of first radiators 111 form a 4×4 array. As shown in FIG. 6, the plurality of second radiators 121 form a 4×4 array, and the array formed by the plurality of second radiators 121 corresponds to the array formed by the plurality of first radiators 111. In this case, an array antenna includes a plurality of antennas 10 in package arranged in an array, to implement beam sweeping. In this way, the array antenna can be better applied to a high-speed millimeter-wave communications system.

As shown in FIG. 3, the plurality of antennas 10 in package are coupled to one chip 2, and the chip 2 sends and receives a same signal through the plurality of antennas 10 in package, so that the signal sent and received by the antennas 10 in package in the package structure 100 has comparatively high strength.

In an embodiment, referring to FIG. 3, FIG. 4, and FIG. 6, there are a plurality of first conductive blocks 112 on the first conductor layer 11. The plurality of first radiators 111 are spaced away from each other, the plurality of first conductive blocks 112 are spaced away from each other, and the first radiator 111 and the first conductive block 112 adjacent to the first radiator 111 are spaced away from each other. There are a plurality of second conductive blocks 122 on the second conductor layer 12. The plurality of second radiators 121 are spaced away from each other, the plurality of second conductive blocks 122 are spaced away from each other, and the second radiator 121 and the second conductive block 122 adjacent to the second radiator 121 are spaced away from each other.

In an embodiment, referring to FIG. 6, there are a plurality of second conductive blocks 122 on the second conductor layer 12. The plurality of second conductive blocks 122 are arranged in an array. A first conductive strip 123 is connected between adjacent second conductive blocks 122. In other words, the adjacent second conductive blocks 122 are connected through the first conductive strip 123. All the first conductive strips 123 and the second conductive blocks 122 jointly form a first grid electric wall 120. There are a plurality of grid spaces 124 on the first grid electric wall 120. The plurality of grid spaces 124 may be arranged in an array. There are a plurality of second radiators 121. Different second radiators 121 are distributed in different grid spaces 124. In other words, four second conductive blocks 122 disposed around one second radiator 121 and four first conductive strips 123 connected between the second conductive blocks 122 jointly form a grid space 124 in a surrounding manner.

In this embodiment, disposing of the plurality of first conductive strips 123 further increases the residual copper ratio of the second conductor layer 12, thereby increasing a product yield rate of the substrate 1. The plurality of second radiators 121 are located in the grid spaces 124 of the first grid electric wall 120 in a one-to-one corresponding manner, and each of the second radiators 121 is surrounded by the first grid electric wall 120. Therefore, coupling between different second radiators 121 can be reduced through the first grid electric wall 120, that is, near-field crosstalk between different antennas 10 in package can be reduced, thereby improving isolation between different antennas 10 in package. In addition, all the grid spaces 124 of the first grid electric wall 120 having an encircling electric wall structure form a radiation window. This helps increase an antenna gain of the antenna 10 in package.

As shown in FIG. 6, the array in which the plurality of second conductive blocks 122 are arranged has an array row direction X and an array column direction Y, and the array row direction X and the array column direction Y are perpendicular to each other. When the first conductive strip 123 is in a straight line, an extension direction of the first conductive strip 123 is the array row direction X or the array column direction Y. Alternatively, the first conductive strip 123 may be curved. A shape of the first conductive strip 123 is not strictly limited in this application.

In an embodiment, referring to FIG. 6, a slot 125 is disposed on the first conductive strip 123. Adjacent grid 124 spaces communicate with each other through the slot 125. In other words, two grid spaces 124 located on two sides of the first conductive strip 123 communicate with each other through the slot 125. The slot 125 enables all the grid spaces 124 on the first grid electric wall 120 to communicate with each other. This can ensure resin fluidity and gas fluidity in the substrate 1 in a pressing manufacturing process of the substrate 1, and further reduce a probability of occurrence of bubbles during lamination. Therefore, the product yield rate of the substrate 1 is comparatively high.

A single slot 125 may be disposed on each first conductive strip 123, or a plurality of slots 125 may be disposed on each first conductive strip 123. A quantity of slots 125 is set based on a resin fluidity requirement in a pressing process of the substrate 1.

Figure 7:
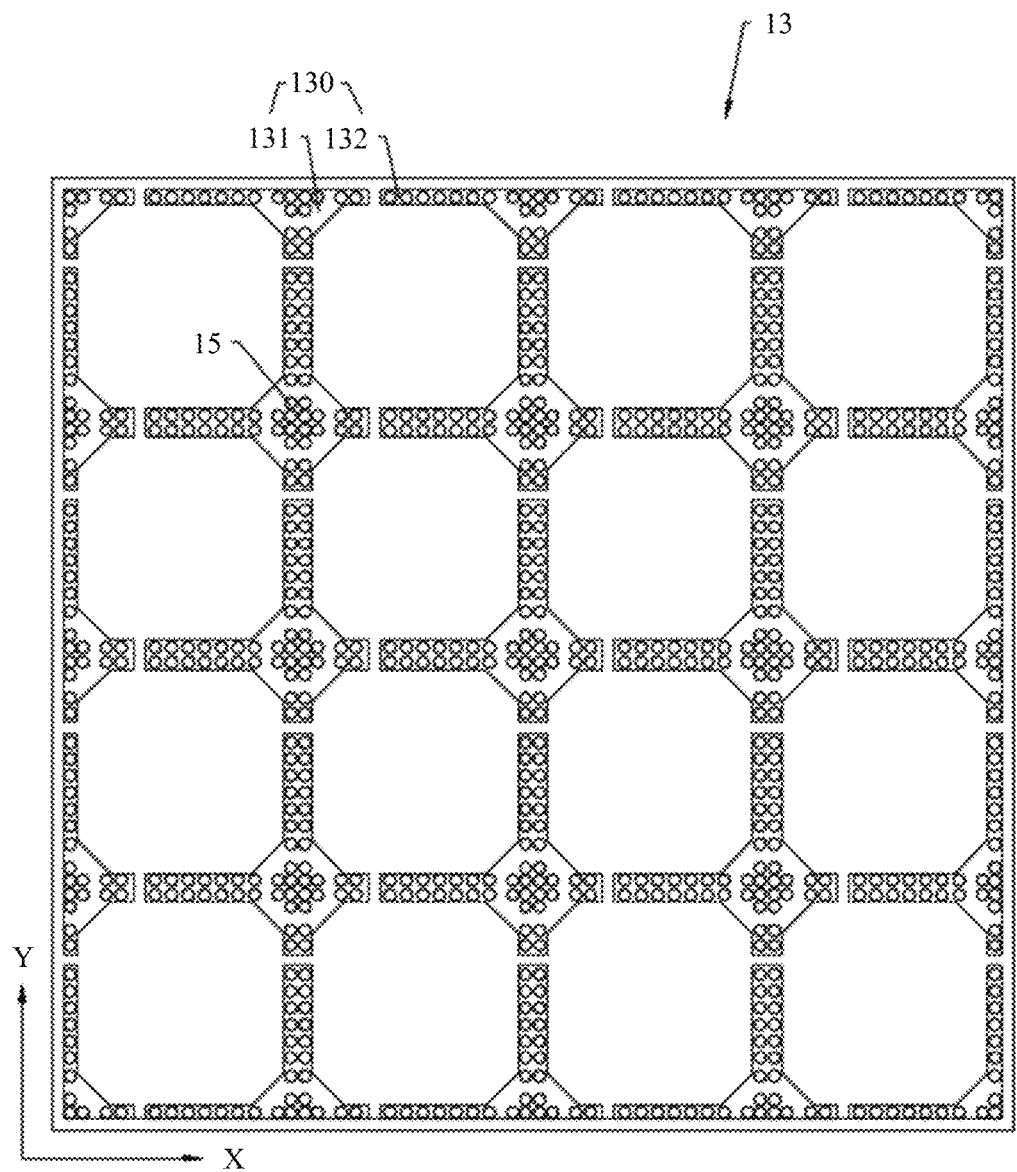
FIG. 7 is a top view of a third conductor layer and a first conductive column in the package structure shown in FIG. 3.

In an embodiment, referring to FIG. 3 and FIG. 7, the first conductor layer 11 and the second conductor layer 12 are spaced away from each other. The substrate 1 further includes at least one third conductor layer 13. The at least one third conductor layer 13 is sandwiched between the first conductor layer 11 and the second conductor layer 12. Each third conductor layer 13 includes a third conductive block 131. A projection of the third conductive block 131 on the core layer 1 does not overlap a projection of the second radiator 121 on the core layer 1. Laying the third conductive block 131 on the third conductor layer 13 implements that the third conductor layer 13 has a comparatively high residual copper ratio. This avoids occurrence of bubbles during manufacturing of the substrate 1, and increases product yield rates of the substrate 1 and the package structure 100.

In an embodiment, referring to FIG. 3 and FIG. 7, there are a plurality of third conductive blocks 131. The plurality of third conductive blocks 131 are arranged in an array. A second conductive strip 132 is connected between adjacent third conductive blocks 131. In other words, the adjacent third conductive blocks 131 are connected through the second conductive strip 132. An extension direction of the second conductive strip 132 is an array row direction X or an array column direction Y. All the second conductive strips 132 and the third conductive blocks 131 jointly form a second grid electric wall 130. In other words, each third conductor layer 13 includes a second grid electric wall 130.

Referring to FIG. 3, FIG. 6, and FIG. 7, a projection of the second grid electric wall 130 on the core layer 1a at least partially overlaps a projection of the first grid electric wall 120 on the core layer 1a. Specifically, projections of a plurality of third conductive blocks 131 on the core layer 1a at least partially overlap projections of a plurality of second conductive blocks 122 on the core layer 1a. Projections of a plurality of second conductive strips 132 on the core layer 1a at least partially overlap projections of a plurality of first conductive strips 123 on the core layer 1a. There are a plurality of grid spaces 133 on the second grid electric wall 130. The plurality of grid spaces 133 are arranged in an array. Projections of different second radiators 121 on the third conductor layer 13 are distributed in different grid spaces 133.

In this embodiment, each third conductor layer 13 includes the second grid electric wall 130, and the projection of the second grid electric wall 130 on the core layer 1a at least partially overlap the projection of the first grid electric wall 120 on the core layer 1a. No copper material is laid in an area, on each third conductor layer 13, that directly faces the first radiator 111 and the second radiator 121. Therefore, disposing of the second grid electric wall 130 does not affect coupling between the first radiator 111 and the second radiator 121, and a residual copper ratio of each third conductor layer 13 can be further increased instead. This improves a product yield rate of the substrate 1, reduces coupling between different antennas 10 in package, and improves array performance of the antenna 10 in package in the package structure 100.

In some embodiments, the second grid electric wall 130 and the first grid electric wall 120 have same shapes, and the projection of the second grid electric wall 130 on the core layer 1a completely overlaps the projection of the first grid electric wall 120 on the core layer 1a, to simplify a manufacturing process of the substrate 1 and reduce costs of the substrate 1.

In an embodiment, referring to FIG. 3, FIG. 6, and FIG. 7, the substrate 1 further includes a plurality of first conductive columns 15. The plurality of first conductive columns 15 are connected between two adjacent second grid electric walls 130 and are connected between the first grid electric wall 120 and a second grid electric wall 130 adjacent to the first grid electric wall 120. The plurality of first conductive columns 15 are formed on a dielectric layer 1c between the two adjacent second grid electric walls 130 and formed on a dielectric layer 1c between the first grid electric wall 120 and the second grid electric wall 130 adjacent to the first grid electric wall 120. A via may be disposed on a corresponding dielectric layer 1c, and a conductive material (for example, copper) is filled in the via to form the first conductive column 15.

In this embodiment, the plurality of first conductive columns 15 are used to connect the two adjacent second grid electric walls 130, and to connect the second grid electric wall 130 and the first grid electric wall 120 adjacent to the second grid electric wall 130, so that the second grid electric wall 130, the first conductive column 15, and the first grid electric wall 120 jointly form a stereoscopic electric wall. The stereoscopic electric wall penetrates through the at least one third conductor layer 13, the second conductor layer 12, a dielectric layer 1c sandwiched between the adjacent third conductor layers 13, and a dielectric layer sandwiched between the third conductor layer 13 and a second conductor layer 12 adjacent to the third conductor layer 13, so that a stereoscopic isolation effect can be achieved. This effectively reduces near-field coupling between different antennas 10 in package on the substrate 1, reduces crosstalk between the different antennas 10 in package, and improves array performance of the antennas 10 in package in the package structure 100. The stereoscopic electric wall can further form a stereoscopic radiation window. This helps increase an antenna gain.

Each second conductive block 122 is connected to at least two rows of first conductive columns 15. Two rows of first conductive columns 15 of the at least two rows of first conductive columns 15 are perpendicularly intersected with each other in arrangement directions. For example, as shown in FIG. 6 and FIG. 7, each second conductive block 122 is connected to four rows of first conductive columns 15. Two rows of first conductive columns 15 are arranged along an array row direction X, the other two rows of first conductive columns 15 are arranged along an array column direction Y, and the two rows of first conductive columns 15 arranged along the array row direction X are intersected with the two rows of first conductive columns 15 arranged along the array column direction Y.

In this embodiment, two rows of first conductive columns 15 of at least two rows of first conductive columns 15 are intersected with each other in arrangement directions, and each row of first conductive columns 15 can form one isolation wall. Therefore, two intersected isolation walls are formed between the first grid electric wall 120 and the second grid electric wall 130 adjacent to the first grid electric wall 120, to implement isolation in different directions. In this way, the stereoscopic electric wall can implement multi-directional isolation and has a better isolation effect, and the antenna 10 in package in the package structure 100 has better array performance.

In some embodiments, as shown in FIG. 6 and FIG. 7, two rows of first conductive columns 15 of at least two rows of first conductive columns 15 that are connected to one second conductive block 122 are perpendicular to each other in arrangement directions (for example, one row of first conductive columns 15 are arranged along an array row direction X, and the other row of first conductive columns 15 are arranged along an array column direction Y), to form two perpendicular isolation walls. Because a plurality of second conductive blocks 122 are arranged in an array, isolation walls connected to the plurality of second conductive blocks 122 can jointly form an approximately grid-shaped isolation environment, so that isolation can be better implemented in cooperation with the first grid electric wall 120 and the second grid electric wall 130, and the stereoscopic electric wall has a better isolation effect.

As shown in FIG. 6 and FIG. 7, each first conductive strip 123 is connected to at least two rows of first conductive columns 15. Each row of first conductive columns 15 are arranged along an extension direction of the corresponding first conductive strip 123. The at least two rows of first conductive columns 15 form at least two stacked isolation walls, so that an isolation wall of the stereoscopic electric wall is comparatively thick, and a signal cannot penetrate the isolation wall of the stereoscopic electric wall. Therefore, the stereoscopic electric wall has a better isolation effect, and the antenna 10 in package in the package structure 100 has better array performance.

First conductive columns 15 connected to the first conductive strip 123 and first conductive columns 15 connected to the second conductive blocks 122 located on two sides of the first conductive strip 123 are continuously arranged in a direction (for example, the array row direction X or the array column direction Y), so that isolation walls formed by the first conductive columns 15 are continuous in an arrangement direction, to improve an isolation effect of the stereoscopic electric wall.

It may be understood that, each first conductive strip 123 may be alternatively connected to one row of first conductive columns 15. A thickness of the isolation wall of the stereoscopic electric wall may be increased by increasing a diameter of the first conductive column 15. A quantity of rows of first conductive columns 15 that are connected to each first conductive strip 123 and the diameter of the first conductive column 15 are not strictly limited in this application.

For disposing of the first conductive column 15 connected between the two adjacent second grid electric walls 130, refer to the disposing of the first conductive column 15 connected between the first grid electric wall 120 and the second grid electric wall 130 adjacent to the first grid electric wall 120. For example, first conductive columns 15 located on different dielectric layers 1c are arranged in a same manner, and projections of the first conductive columns 15 on the core layer 1a at least partially overlap with each other.

It may be understood that, in another embodiment, a connection relationship of the first conductive column 15 may be alternatively different from the connection relationship in the foregoing embodiment, and the first conductive column 15 may be connected to any two of a first grid electric wall 120 and at least one second grid electric wall 130.

In an embodiment, the first conductive block 112 may be floating (not electrically connected to another structure), or may be electrically connected to another structure. Referring to FIG. 3 and FIG. 4, an example in which the first conductive block 112 is electrically connected to the second grid electric wall 130 is used for description in this application.

The substrate 1 further includes a plurality of second conductive columns 14. The plurality of second conductive columns 14 are connected between the first conductive block 112 and the second grid electric wall 130 adjacent to the first conductive block 112. The second grid electric wall 130 is disposed close to the first conductive block 112. The plurality of second conductive columns are connected to the plurality of third conductive blocks 131 on the second grid electric wall 130 (as shown in FIG. 7). The plurality of second conductive columns 14 are formed on a dielectric layer 1c between the first conductive block 112 and the second grid electric wall 130 adjacent to the first conductive block 112. A via may be disposed on the dielectric layer 1c, and a conductive material (for example, copper) is filled in the via to form the second conductive column 14.

In this embodiment, the plurality of first conductive blocks 112, the plurality of second conductive columns 14, the second grid electric wall 130, the first conductive column 15, and the first grid electric wall 120 jointly form a stereoscopic electric wall. The stereoscopic electric wall extends from the conductor layer on which the first radiator 111 is located to the conductor layer on which the second radiator 121 is located, so that near-field coupling between different antennas 10 in package in the substrate 1 can be effectively reduced, that is, crosstalk between different antennas 10 in package can be reduced, and array performance of the antennas 10 in package in the package structure 100 can be improved. A radiation window formed by the stereoscopic electric wall helps increase an antenna gain.

Each first conductive block 112 is connected to at least two rows of second conductive columns 14. Two rows of second conductive columns 14 of the at least two rows of second conductive columns 14 are intersected with each other in arrangement directions. As shown in FIG. 4, the first conductive blocks 112 are arranged in an array, and the array has an array row direction X and an array column direction Y. Each first conductive block 112 is connected to four rows of second conductive columns 14. Two rows of second conductive columns 14 are arranged along the array row direction X, the other two rows of second conductive columns 14 are arranged along the array column direction Y, and the two rows of second conductive columns 14 arranged along the array row direction X are intersected with the two rows of second conductive columns 14 arranged along the array column direction Y.

In this embodiment, because of arrangement directions of at least two rows of second conductive columns 14 are intersected with each other in arrangement directions, and each row of second conductive columns 14 can form one isolation wall. Therefore, two intersected isolation walls are formed between the first conductive block 112 and the second grid electric wall 130 adjacent to the first conductive block 112, to implement isolation in different directions. In this way, the stereoscopic electric wall can implement multi-directional isolation and has a better isolation effect, and the antenna 10 in package in the package structure 100 has better array performance.

In some embodiments, as shown in FIG. 4, two rows of second conductive columns 14 of at least two rows of second conductive columns 14 that are connected to one first conductive block 112 are perpendicular to each other in arrangement directions (for example, one row of second conductive columns 14 are arranged along an array row direction X, and the other row of second conductive columns 14 are arranged along an array column direction Y), to form two perpendicular isolation walls. Because a plurality of first conductive blocks 112 are arranged in an array, isolation walls connected to the plurality of first conductive blocks 112 can jointly form an approximately grid-shaped isolation environment, so that isolation can be better implemented in cooperation with the second grid electric wall 130, and the stereoscopic electric wall has a better isolation effect.

Figure 8:
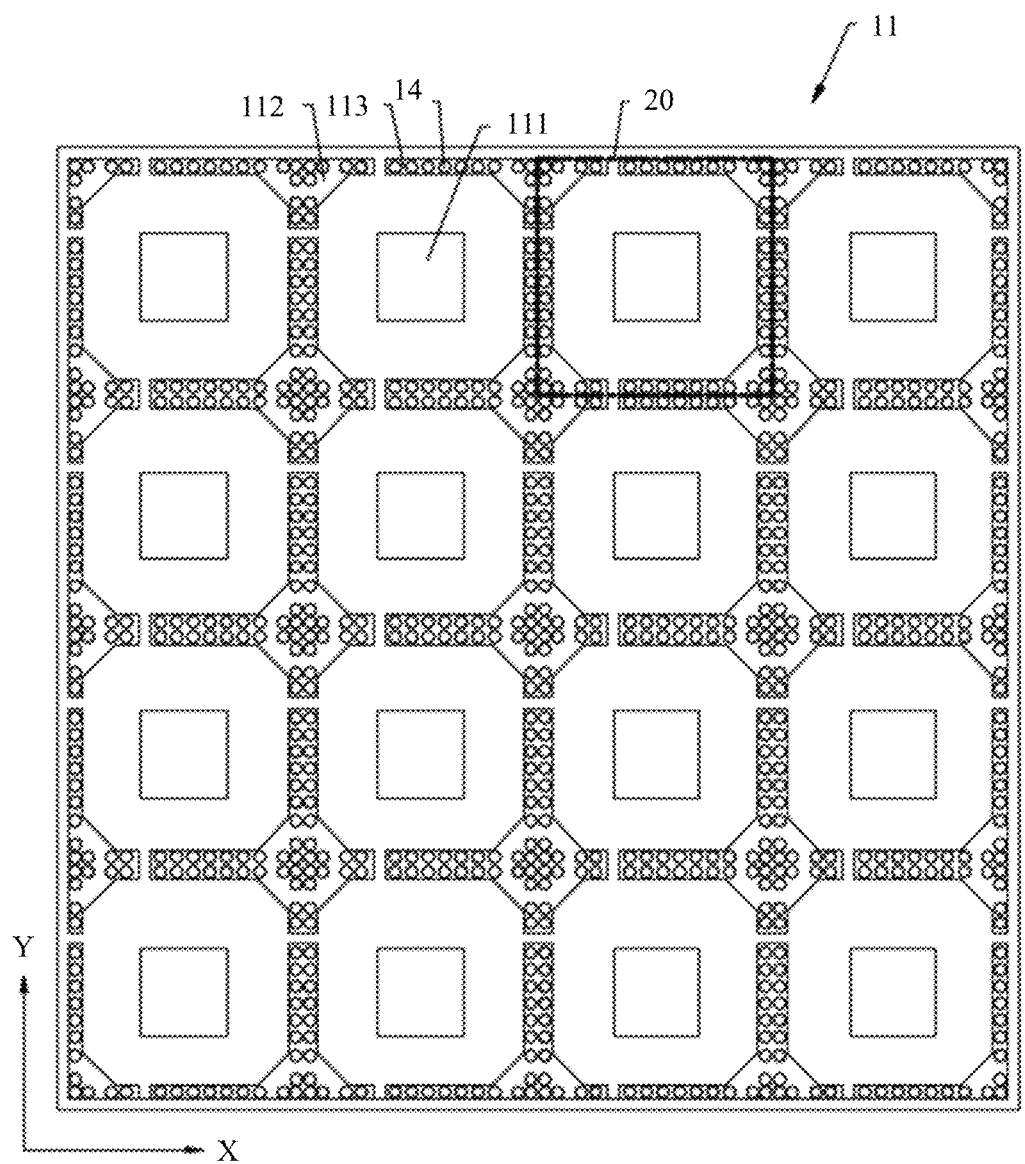
FIG. 8 is a top view of a first conductor layer and a second conductive column in the package structure shown in FIG. 3 in another embodiment.

In an embodiment, referring to FIG. 8, a connection strip 113 is connected between two adjacent first conductive blocks 112. In other words, the two adjacent first conductive blocks 112 are connected through the connection strip 113. All the connection strips 113 and the first conductive blocks 112 are arranged to jointly form a grid shape. In this case, each grid on the first conductor layer 11 forms one isolation unit 20.

In this embodiment, a plurality of connection strips 113 and a plurality of first conductive blocks 112 on the first conductor layer 11 jointly form a grid-shaped electric wall. This can increase a residual copper ratio of the first conductor layer 11, and reduce coupling between different first radiators 111, so that the package structure 100 has comparatively good performance.

Each connection strip 113 is connected to at least two rows of second conductive columns 14. Each row of second conductive columns 14 are arranged along an extension direction of the corresponding connection strip 113. All the connection strips 113 are connected to form a part of the stereoscopic electric wall. The at least two rows of second conductive columns 14 form at least two stacked isolation walls, so that an isolation wall of the stereoscopic electric wall is comparatively thick, and a signal cannot penetrate the isolation wall of the stereoscopic electric wall. Therefore, the stereoscopic electric wall has a better isolation effect, and the antenna 10 in package in the package structure 100 has better array performance.

It may be understood that, each connection strip 113 may be alternatively connected to one row of second conductive columns 14. A thickness of the isolation wall of the stereoscopic electric wall may be increased by increasing a diameter of the second conductive column 14. A quantity of rows of second conductive columns 14 that are connected to each connection strip 113 and the diameter of the second conductive column 14 are not strictly limited in this application.

For disposing of the second conductive column 14, refer to the disposing of the first conductive column 15 in the foregoing embodiment. For example, a projection of the second conductive column 14 on the core layer 1a at least partially overlap a projection of the first conductive column 15 on the core layer 1a.

In an embodiment, referring to FIG. 2 and FIG. 3, the substrate 1 includes a plurality of conductor layers 1b. The core layer 1a and the plurality of conductor layers 1b are disposed in a stacked manner. The plurality of conductor layers 1b are made of a conductive material. In this application, a copper material is used as an example for description. A layout ratio of the conductive material for the conductor layers 1b is a residual copper ratio. A specific type of the conductive material is not strictly limited in this application.

The plurality of conductor layers 1b are distributed on two sides of the core layer 1a. The plurality of conductor layers 1b include an upper part and a lower part. The upper part of the conductor layers 1b is distributed on a side that is of the core layer 1a and that is farther away from the chip 2, and the lower part of the conductor layers 1b is distributed on a side that is of the core layer 1a and that is closer to the chip 2. The upper part of the conductor layers 1b and the lower part of the conductor layers 1b may be symmetrically disposed relative to the core layer 1a, to reduce a probability that the substrate 1 is warped during manufacturing. As shown in FIG. 2 and FIG. 3, there are five layers in the upper part of the conductor layer 1b, and there are five layers in the lower part of the conductor layer 1b. The upper part of the conductor layers 1b and the lower part of the conductor layers 1b are symmetrical relative to the core layer 1a. Certainly, in another embodiment, the upper part of the conductor layers 1b and the lower part of the conductor layers 1b may alternatively not be symmetrically disposed relative to the core layer 1a. For example, a quantity of layers in the upper part of the conductor layers 1b is different from a quantity of layers in the lower part of the conductor layers 1b.

The plurality of conductor layers 1b include the first conductor layer 11 and the second conductor layer 12. The first conductor layer 11 is located on the side that is of the core layer 1a and that is farther away from the chip 2. The second conductor layer 12 is sandwiched between the first conductor layer 11 and the core layer 1a. The plurality of conductor layers 1b further include the third conductor layer 13.

The substrate 1 further includes a protective layer (not shown in the figure). As shown in FIG. 2 and FIG. 3, an example in which the upper part of the conductor layers 1b includes five layers and the lower part of the conductor layers 1b includes five layers is used for description in this application. Protective layers are disposed on both a surface that is of the first layer of the conductor layers 1b and that is farther away from the chip 2 and a surface that is of the tenth layer of the conductor layers 1b and that is closer to the chip 2. The protective layer is an insulation layer. A protective layer is also disposed on the first conductor layer on a side that is of the substrate 1 and that is closer to the chip 2.

In an embodiment, referring to FIG. 3, the plurality of conductor layers 1b further include at least one fourth conductor layer 19. The at least one fourth conductor layer 19 is sandwiched between the core layer 1a and the chip 2. Each fourth conductor layer 19 includes at least one of a conducting wire or a conductive block. The conducting wire may be one or more of a power cable, a ground cable, or a signal cable. The conductive block may be one or more of a ground block and a power supply block. As shown in FIG. 3, a ground block 162 is laid on each fourth conductor layer 19.

In this embodiment, a quantity of fourth conductor layers 19 is the same as total quantities of the first conductor layer 11, the second conductor layer 12, and the third conductor layer 13. In this application, the residual copper ratio of the first conductor layer 11 is comparatively high, and a residual copper ratio of a fourth conductor layer 19 symmetrical to the first conductor layer 11 is close to the residual copper ratio of the first conductor layer 11; the residual copper ratio of the second conductor layer 12 is comparatively high, and a residual copper ratio of a fourth conductor layer 19 symmetrical to the second conductor layer 12 is close to the residual copper ratio of the second conductor layer 12; and the residual copper ratio of the third conductor layer 13 is comparatively high, and a residual copper ratio of a fourth conductor layer 19 symmetrical to the third conductor layer 13 is close to the residual copper ratio of the third conductor layer 13. Therefore, a difference between residual copper ratios of the conductor layers of the substrate 1 that are stacked relative to the core layer 1a is comparatively small, so that co-planarity of the substrate 1 is comparatively good. This can effectively reduce a risk of warping of the substrate 1, and a product yield rate of the substrate 1 is comparatively high.

A ground conductive column 161 is disposed between two ground blocks 162 located on adjacent layers. A ground conductive column 163 is disposed on the core layer 1a. The stereoscopic electric wall is grounded through the ground conductive column 163, the ground conductive column 161, the ground block 162, and a solder ball 1d. The ground conductive column 161 is configured to provide overall signal reflow and heat dissipation for the package structure 100.

Figure 9:
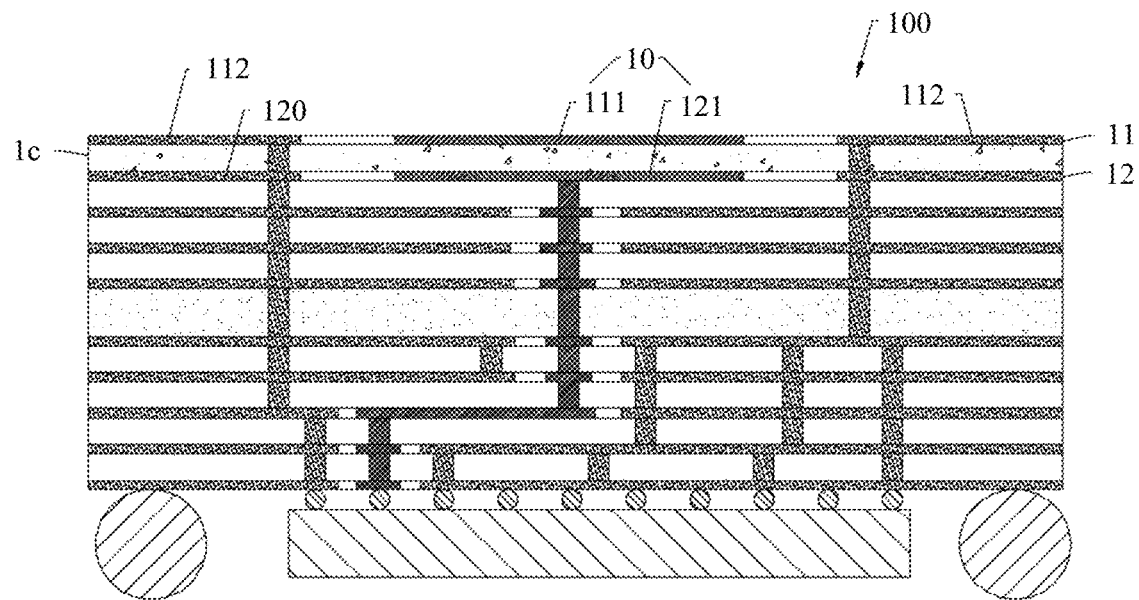
FIG. 9 is a schematic structural diagram of a package structure of the electronic device shown in FIG. 1 in yet another embodiment.

In an embodiment, referring to FIG. 9, the first conductor layer 11 and the second conductor layer 12 are adjacently disposed. In this case, the dielectric layer 1c between the first radiator 111 and the second radiator 121 is made of a material with a low dielectric constant (for example, less than 1.5), to meet a bandwidth requirement of the antenna 10 in package.

The package structure 100 further includes a plurality of third conductive columns. The plurality of third conductive columns are configured to connect a plurality of first conductive blocks 112 and the first grid electric wall 120. In this case, the plurality of first conductive blocks 112, the plurality of third conductive columns, and the first grid electric wall 120 form a stereoscopic electric wall, to reduce coupling between antennas 10 in package. The antennas 10 in package in the package structure 100 has comparatively high array performance. For disposing of the third conductive column, refer to the disposing of the first conductive column 15 or the second conductive column 14 in the foregoing embodiment.

In an embodiment, the first conductive block 112 is made of a metallic material. The metallic material is conductive, so that the first conductive block 112 can implement a function of an electric wall. The second conductive block 122 may also be made of a metallic material. The third conductive block 131 may also be made of a metallic material. In another embodiment, the first conductive block 112, the second conductive block 122, and the third conductive block 131 may be alternatively made of another conductive material.

In an embodiment, the substrate 1 further includes a dielectric layer 1c sandwiched between the first radiator 111 and the second radiator 121. The dielectric layer 1c is made of a low-dielectric-constant material. A structure in which the first radiator 111 and the second radiator 121 in the antenna 10 in package are stacked, and the dielectric layer 1c that is made of a low-dielectric-constant material and that is sandwiched between the first radiator 111 and the second radiator 121 help the antenna 10 in package implement performance of a high bandwidth and a high gain.

The substrate 1 further includes a dielectric layer 1c distributed at another location. The dielectric layer 1c is filled between adjacent conductor layers 1b to implement insulation. No dielectric layer 1c is disposed between the core layer 1a and a conductor layer 1b closest to the chip 2.

When the upper part of the conductor layers 1*b* and the lower part of the conductor layers 1*b* are symmetrically disposed relative to the core layer 1*a*, a plurality of dielectric layers 1*c* are symmetrically disposed on two sides of the core layer 1*a*. The plurality of dielectric layers 1*c* are made of an insulation material.

A person skilled in the art do not consider the plurality of dielectric layers 1*c* and the core layer 1*a* as a same entity. The core layer 1 is a basis of a process of the package structure. In a packaging process, both the dielectric layer 1*c* and the conductor layer 1*b* are formed around the core layer 1. Both the plurality of dielectric layers 1*c* and the core layer 1 are made of an insulation material. In consideration of factors such as thermal expansion, the plurality of dielectric layers 1*c* and the core layer 1 are usually made of materials with similar physical characteristics. However, a photoresist is further added to the material for the core layer 1*a*. The photoresist has a function of blocking light in an exposure process of the plurality of conductor layers 1*b*, to ensure a manufacturing yield rate of the plurality of conductor layers 1*b* of the substrate 1. For example, the material for the core layer 1 may be a combination of organic resin, glass-fiber fabric, and a photoresist. The material for the dielectric layer 1*c* may be a combination of organic resin and glass-fiber fabric.

The core layer 1 is darker than the dielectric layer 1*c* in appearance. Each conductor layer 1*b* has a matte side and a smooth side that are located back to back. Copper teeth are provided on the matte side. Matte sides of two conductor layers 1*b* covering two back-to-back surfaces of the core layer 1 are disposed opposite to each other, that is, surfaces, of the two conductor layers 1*b*, on which copper teeth are provided are opposite to each other. Matte sides of two conductor layers 1*b* covering two back-to-back surfaces of the dielectric layer 1*c* face a same direction, that is, a matte side of one conductor layer 1*b* is connected to the dielectric layer 1*c*, and a smooth side of the other conductor layer 1*b* is connected to the dielectric layer. In addition, the via disposed on the dielectric layer 1*c* is trapezoidal. A via disposed on the core layer 1 is in an hourglass shape or a column shape.

In an embodiment, the feed network 17 uses probe feeding, slot feeding, or dual-probe feeding. When the feed network 17 uses probe feeding or dual-probe feeding, the feed network 17 is electrically connected to the antenna 10 in package directly. When the feed network 17 uses slot feeding, the feed network 17 is electrically connected to the antenna 10 in package in a coupling manner.

Figure 10:
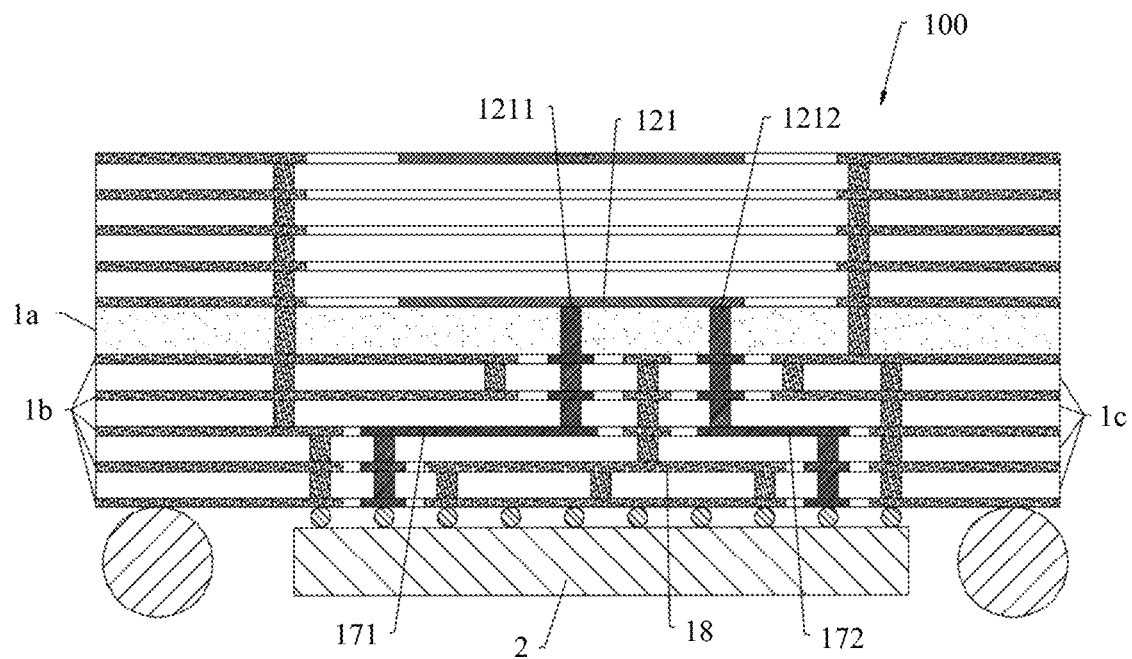
FIG. 10 is a schematic structural diagram of a package structure of the electronic device shown in FIG. 1 in still yet another embodiment.
Figure 11:
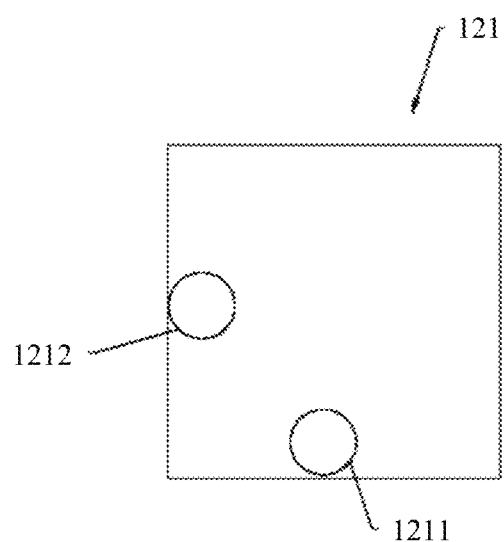
FIG. 11 is a top view of a second radiator of an antenna in package shown in FIG. 10.

In an embodiment, referring to FIG. 10 and FIG. 11, the feed network 17 includes a first feeder 171 and a second feeder 172 that are electrically connected to the chip 2. One second radiator 121 includes a first feeding point 1211 and a second feeding point 1212, the first feeding point 1211 is configured to connect to the first feeder 171, the second feeding point 1212 is configured to connect to the second feeder 172, and the first feeding point 1211 and the second feeding point 1212 are spaced away from each other. In this embodiment, the feed network 17 uses dual-probe feeding.

The first feeder 171 includes a trace routed on the conductor layer 1*b*, a via disposed on the dielectric layer 1*c* (where a conductive material is filled in a via on the dielectric layer 1*c*), and a via disposed on the core layer 1*a* (where a conductive material is filled in a via on the core layer 1*a*). The second feeder 172 includes a trace routed on the conductor layer 1*b*, a via disposed on the dielectric layer 1*c* (where a conductive material is filled in a via on the dielectric layer 1*c*), and a via disposed on the core layer 1*a* (where a conductive material is filled in a via on the core layer 1*a*). The first feeder 171 and the second feeder 172 are spaced away from each other. An isolation wall 18 is disposed between the first feeder 171 and the second feeder 172, and the isolation wall 18 is configured to reduce coupling between the first feeder 171 and the second feeder 172, so that a signal that is sent or received by the antenna 10 in package has high quality. The isolation wall 18 includes the trace routed on the conductor layer 1*b* and the via disposed on the dielectric layer 1*c* (where a conductive material is filled in a via on the dielectric layer 1*c*).

In this embodiment, because one second radiator 121 includes a first feeding point 1211 and a second feeding point 1212, that is, because two polarization feeding ports are disposed on the single antenna 10 in package, and either of the two polarization feeding ports may be used as a horizontal polarization feeding port or a vertical polarization feeding port, a combination of the two polarization feeding ports is used for dual-polarization feeding. Circular polarization or elliptical polarization can be implemented for the antenna 10 in package by performing amplitude and phase adjustment on both the two feeding ports.

Certainly, in another embodiment, as shown in FIG. 2 and FIG. 3, one feeding point may be alternatively disposed on one second radiator 121, and the feed network 17 is connected to the feeding point, so that the antenna 10 in package in the package structure 100 implements single polarization feeding. In this embodiment, the feed network 17 uses probe feeding.

The chip 2 is a radio frequency element (Radio Frequency Integrated Circuit, RFIC), and the chip 2 sends and receives a radio frequency signal through the first radiator 111 and the second radiator 121. A silicon chip is used as a base material for the chip 2, and an integrated circuit is disposed on the silicon chip. The chip 2 is configured to provide active excitation, including an amplitude and phase adjustment function, and the chip 2 provides feeding for the first radiator 111 and the second radiator 121. The chip 2 includes a plurality of pins 21, and the plurality of pins 21 may be solder pads disposed on a surface of the silicon chip. The plurality of pins 21 include a ground pin, a power supply pin, an input/output pin, a signal control pin, and the like. The chip 2 is electrically connected to the substrate 1 through the pins 21. A plurality of solder balls (solder ball) 1*d* are disposed on a side that is of the substrate 1 and that faces the chip 2. The plurality of solder balls 1*d* are configured to fasten the package structure 100 to the circuit board 300 (as shown in FIG. 1), to structurally and electrically connect the package structure 100 and the circuit board 300.

Referring to FIG. 1 to FIG. 11, an embodiment of this application further provides a communications device 200. The communications device 200 includes a circuit board 300 and the package structure 100 with the antenna 10 in package described in the foregoing embodiments. The package structure 100 is disposed on the circuit board 300. The communications device 200 may be a product such as a mobile phone, a tablet computer, or a router. For example, the circuit board 300 may be a mainboard of the mobile phone.

For example, the communications device 200 may be the mobile phone shown in FIG. 1. The circuit board 300 and the package structure 100 are disposed inside a housing 400 of the communications device 200. The antenna 10 in package is configured to send and receive a radio frequency signal. The radio frequency signal includes but is not limited to a wireless local area network (Wireless-Fidelity, Wi-Fi) signal, a Bluetooth signal, a global navigation satellite system (Global Navigation Satellite System, GNSS) signal, a 2G (2-Generation wireless telephone technology, second generation wireless telephone technology) signal, a 3G (3-Generation wireless telephone technology, 3rd generation wireless telephone technology) signal, a 4G (4-Generation wireless telephone technology, 4th generation wireless telephone technology) signal, or a 5G (5-Generation wireless telephone technology, 5th generation wireless telephone technology) signal.

The foregoing descriptions are merely specific embodiments of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A package structure with an antenna in package, wherein the package structure comprises a substrate and a chip fastened under the substrate, wherein the antenna in package comprises a first radiator, wherein the substrate comprises a core layer and a first conductor layer, wherein the first radiator and a first conductive block are disposed on the first conductor layer, wherein the package structure further comprises a feed network, wherein the chip is coupled to the feed network, and wherein the feed network provides feeding for the antenna in package, wherein the substrate further comprises a second conductor layer, wherein the antenna in package further comprises a second radiator, wherein the second radiator and a second conductive block are disposed on the second conductor layer, and wherein a projection of the second radiator on the core layer at least partially overlaps a projection of the first radiator on the core layer.

2. The package structure according to claim 1, wherein one or more isolation units are disposed on the first conductor layer, wherein the one or more isolation units each comprise the first conductive block, and wherein the one or more isolation units are configured to isolate at least two first radiators from each other.

3. The package structure according to claim 1, wherein at least two second radiators are disposed on the second conductor layer, and wherein the second conductive block is configured to isolate the at least two second radiators from each other.

4. The package structure according to claim 1, wherein the package structure further comprises a plurality of second conductive blocks, wherein the plurality of second conductive blocks are arranged in an array, and wherein a first conductive strip is connected between adjacent second conductive blocks, wherein all the first conductive strips and all the second conductive blocks jointly form a first grid electric wall, wherein the first grid electric wall comprises a plurality of grid spaces, and wherein different second radiators of a plurality of second radiators are distributed in different grid spaces.

5. The package structure according to claim 4, wherein a slot is disposed on the first conductive strip, and wherein adjacent grid spaces communicate with each other through the slot.

6. The package structure according to claim 4, wherein the substrate further comprises at least one third conductor layer, wherein the at least one third conductor layer is sandwiched between the first conductor layer and the second conductor layer, wherein each third conductor layer comprises a second grid electric wall, and wherein a projection of the second grid electric wall on the core layer at least partially overlaps a projection of the first grid electric wall on the core layer.

7. The package structure according to claim 6, wherein the substrate further comprises a plurality of first conductive columns, and wherein the plurality of first conductive columns are connected between two adjacent second grid electric walls and are connected between the first grid electric wall and a second grid electric wall adjacent to the first grid electric wall.

8. The package structure according to claim 7, wherein each second conductive block is connected to at least two rows of first conductive columns, and wherein two rows of first conductive columns of the at least two rows of first conductive columns are intersected with each other in arrangement directions.

9. The package structure according to claim 7, wherein each first conductive strip is connected to at least two rows of first conductive columns, and wherein each row of first conductive columns are arranged along an extension direction of a corresponding first conductive strip.

10. The package structure according to claim 7, wherein the first conductor layer comprises a plurality of first conductive blocks, wherein the first conductive blocks on the first conductor layer are arranged in an array, wherein the substrate further comprises a plurality of second conductive columns, and wherein the plurality of second conductive columns are connected between the first conductive block and the second grid electric wall adjacent to the first conductive block.

11. The package structure according to claim 10, wherein each first conductive block is connected to at least two rows of second conductive columns, and wherein two rows of second conductive columns of the at least two rows of second conductive columns are intersected with each other in arrangement directions.

12. The package structure according to claim 1, wherein the substrate comprises a plurality of conductor layers, wherein the core layer and the plurality of conductor layers are disposed in a stacked manner, wherein the plurality of conductor layers are distributed on two sides of the core layer, and wherein the plurality of conductor layers comprise the first conductor layer and the second conductor layer.

13. The package structure according to claim 12, wherein the plurality of conductor layers further comprise at least one fourth conductor layer, wherein the at least one fourth conductor layer is sandwiched between the core layer and the chip, and wherein each fourth conductor layer comprises at least one of a conducting wire or a conductive block.

14. The package structure according to claim 1, wherein the first conductive block is made of a metallic material.

15. The package structure according to claim 1, wherein the substrate comprises a dielectric layer sandwiched between the first radiator and the second radiator, and wherein the dielectric layer is made of a low-dielectric-constant material.

16. The package structure according to claim 1, wherein the feed network uses at least one of probe feeding, slot feeding, or dual-probe feeding.

17. The package structure according to claim 1, wherein the feed network comprises a first feeder and a second feeder that are electrically connected to the chip, wherein one second radiator comprises a first feeding point and a second feeding point, wherein the first feeding point is configured to connect to the first feeder, wherein the second feeding point is configured to connect to the second feeder, and wherein the first feeding point and the second feeding point are spaced away from each other.

\* \* \* \* \*